United States Patent
Chen et al.

(10) Patent No.: US 10,050,819 B2
(45) Date of Patent: Aug. 14, 2018

(54) MODULATION PROCESSING METHOD AND APPARATUS FOR HIGH-ORDER CODING, BASE STATION, AND TERMINAL

(71) Applicant: ZTE CORPORATION, Shenzhen, Guangdong Province (CN)

(72) Inventors: Zewei Chen, Shenzhen (CN); Bo Dai, Shenzhen (CN); Yu Ngok Li, Shenzhen (CN); Zhisong Zuo, Shenzhen (CN); Jun Xu, Shenzhen (CN); Shuqiang Xia, Shenzhen (CN)

(73) Assignee: ZTE Corporation, Shenzhen, Guangdong Province (CN)

(*) Notice: Subject to any disclaimer, the term of this patent is extended or adjusted under 35 U.S.C. 154(b) by 0 days.

(21) Appl. No.: 15/309,804

(22) PCT Filed: Sep. 1, 2014

(86) PCT No.: PCT/CN2014/085689
§ 371 (c)(1),
(2) Date: Nov. 9, 2016

(87) PCT Pub. No.: WO2015/169013
PCT Pub. Date: Nov. 12, 2015

(65) Prior Publication Data
US 2017/0171014 A1 Jun. 15, 2017

(30) Foreign Application Priority Data
May 9, 2014 (CN) .......................... 2014 1 0197177

(51) Int. Cl.
*H04L 27/36* (2006.01)
*H04L 1/00* (2006.01)
(Continued)

(52) U.S. Cl.
CPC .............. *H04L 27/36* (2013.01); *H03C 7/02* (2013.01); *H04L 1/0009* (2013.01);
(Continued)

(58) Field of Classification Search
CPC ... H04L 1/0003; H04L 1/0016; H04L 1/0026; H04L 27/0008; H04W 72/0406; H04W 72/0413; H04W 72/042
See application file for complete search history.

(56) References Cited

U.S. PATENT DOCUMENTS 9,264,195 B2 * 2/2016 Park ...................... H04L 5/0094
9,491,654 B2 * 11/2016 Ko ........................ H04B 7/0626
(Continued)

FOREIGN PATENT DOCUMENTS

CN 102088789 A 6/2011
CN 102624481 A 8/2012
(Continued)

OTHER PUBLICATIONS

U.S. Appl. No. 61/984,701, "Modulation Coding Scheme (MCS) Indication in LTE Uplink", Specification & Drawing, filed Apr. 25, 2014.*
(Continued)

*Primary Examiner* — Duc M Nguyen
(74) *Attorney, Agent, or Firm* — Ling Wu; Stephen Yang; Ling and Yang Intellectual Property

(57) ABSTRACT

The present document provides a modulation processing method and apparatus for high-order coding, a base station and a terminal, herein the method includes: a base station selecting a Modulation and Coding Scheme (MCS) table according to a transmission type and predefined information, herein the MCS table includes a MCS table supporting a M-order modulation and a MCS table not supporting a M-order modulation, herein M>64; and the base station
(Continued)

A base station selects an MCS table according to a transmission type and predefined information, wherein the MCS table comprises a MCS table supporting a M-order modulation and a MCS table not supporting a M-order modulation, wherein M>64 — S102

The base station transmits the downlink control signaling to a terminal, the downlink control signaling comprising a modulation and coding scheme domain IMCS, wherein the IMCS is based on the MCS table supporting or not supporting a M-order modulation scheme selected by the base station — S104 transmitting downlink control signaling to a terminal, the downlink control signaling including a modulation and coding scheme field $I_{MCS}$, herein the $I_{MCS}$ is based on the MCS table supporting or not supporting a M-order modulation selected by the base station.

8 Claims, 2 Drawing Sheets

(51) Int. Cl.
| | |
|---|---|
| *H04L 25/03* | (2006.01) |
| *H04L 29/08* | (2006.01) |
| *H03C 7/02* | (2006.01) |
| *H04L 29/06* | (2006.01) |
| *H04L 27/00* | (2006.01) |
| *H04W 72/04* | (2009.01) |

(52) U.S. Cl.
CPC ...... *H04L 1/0026* (2013.01); *H04L 25/03866* (2013.01); *H04L 29/0651* (2013.01); *H04L 29/08108* (2013.01); *H04L 2001/0092* (2013.01); *H04L 2027/0097* (2013.01); *H04W 72/042* (2013.01)

(56) References Cited

U.S. PATENT DOCUMENTS

| | | | |
|---|---|---|---|
| 9,730,211 B2* | 8/2017 | Park | H04W 72/042 |
| 9,794,922 B2* | 10/2017 | Xu | H04W 72/042 |
| 9,888,493 B2* | 2/2018 | Park | H04W 72/1289 |
| 2013/0156014 A1* | 6/2013 | Kim | H04L 5/0051 |
| | | | 370/336 |
| 2014/0092785 A1 | 4/2014 | Song et al. | |
| 2014/0169297 A1* | 6/2014 | Kim | H04L 5/0092 |
| | | | 370/329 |
| 2014/0295909 A1* | 10/2014 | Ouchi | H04W 52/242 |
| | | | 455/522 |
| 2015/0036590 A1* | 2/2015 | Lahetkangas | H04L 1/0003 |
| | | | 370/328 |
| 2015/0085797 A1* | 3/2015 | Ji | H04J 3/16 |
| | | | 370/329 |
| 2015/0117354 A1* | 4/2015 | Dai | H04L 5/0053 |
| | | | 370/329 |
| 2015/0117568 A1* | 4/2015 | Wang | H04L 27/0008 |
| | | | 375/298 |
| 2015/0195818 A1* | 7/2015 | Davydov | H04L 27/3494 |
| | | | 370/329 |
| 2015/0312071 A1* | 10/2015 | Chen | H04L 1/0016 |
| | | | 370/329 |
| 2016/0197760 A1* | 7/2016 | Larsson | H04L 1/0003 |
| | | | 375/298 |
| 2016/0219600 A1* | 7/2016 | Li | H04W 72/1231 |
| 2016/0323855 A1* | 11/2016 | Nakamura | H04L 1/0003 |
| 2016/0323912 A1* | 11/2016 | Nakamura | H04L 1/0026 |
| 2017/0070374 A1* | 3/2017 | Nakamura | H04L 1/0005 |
| 2017/0180099 A1* | 6/2017 | Kim | H04L 5/0057 |
| 2017/0188316 A1* | 6/2017 | Seo | H04W 52/367 |

FOREIGN PATENT DOCUMENTS

| | | |
|---|---|---|
| CN | 103580788 A | 2/2014 |
| JP | 2002538690 A | 11/2002 |
| KR | 1020080050282 A | 6/2008 |
| WO | 2013123961 A1 | 8/2013 |
| WO | 2014029108 A1 | 2/2014 |

OTHER PUBLICATIONS

U.S. Appl. No. 61/971,549, "CSI Reporing Mode for 256QAM Support", Specification, filed Mar. 28, 2014.*
R1-141153; Discussion on configuration aspects for 256QAM; Intel Corporation; 3GPP TSG RAN WG1 Meeting #76bis; Shenzhen, China, Mar. 31-Apr. 4, 2014.
R1-141223; Discussion on 256QAM configuration; Fujitsu; 3GPP TSG RAN WG1 Meeting #76bis; Shenzhen, China, Mar. 31-Apr. 4, 2014.
R1-141338; Further details on 256QAM operation; LG Electronics; 3GPP TSG RAN WG1 Meeting #76bis; Shenzhen, China, Apr. 31-4, 2014.
Intel Corporation; CQI/MCS/TBS Tables for 256QAM and Relevant Signaling; 3GPP TSG RAN WG1 Meeting #76, Prague, Czech Republic, Feb. 10-14, 2014. R1-140118.
Panasonic; MCS Indication for 256QAM; 3GPP TSG-RAN WG1 Meeting 76bis, Mar. 31-Apr. 4, 2014, Shenzhen, China. R1-141212.
Samsung; Discussion on 256QAM related signaling/procedure; 3GPP TSG RAN WG1 #76bis, Shenzhen, China, Mar. 31-Apr. 4, 2014. R1-141286.

* cited by examiner

MODULATION PROCESSING METHOD AND APPARATUS FOR HIGH-ORDER CODING, BASE STATION, AND TERMINAL

TECHNICAL FIELD

The present document relates to the field of communications, and in particular, to a modulation processing method and apparatus for high-order coding, a base station and a terminal.

BACKGROUND

In a mobile communication system, due to the time-varying characteristics of a wireless fading channel, a communication process has a lot of uncertainty. On the one hand, in order to improve the throughput of the system, high-order modulation with a high transmission rate and less redundant error correction codes are used for communication. In this case, the throughput of the system is indeed improved greatly when a signal-to-noise ratio of the wireless fading channel is ideal. However, when the channel is in deep fading, it cannot be guaranteed that the communication is reliable and stable. On the other hand, in order to guarantee the reliability of communication, low-order modulation with a low transmission rate and large redundant error correction codes are used for communication. That is, when the channel is in deep fading, it can be guaranteed that the communication is reliable and stable. However, when the signal-to-noise ratio of the channel is high, improvement of the throughput of the system is restricted due to a low transmission rate, which results in a waste of resources. In the early development of the mobile communication technology, in order to deal with the time-varying characteristics of the wireless fading channel, people can only increase the transmission power of the transmitter and use a low-order large-redundancy modulation and coding scheme to ensure the communication quality of the system when the channel is in deep fading, and there is no time to consider how to improve the throughput of the system. With the progress of the technical level, there is a technology that adaptively adjusts its transmission power, modulation and coding scheme and frame length of data according to a channel state to overcome the time-varying characteristics of the channel, so as to obtain the best communication effect. This technology is called an adaptive modulation and coding technology, which belongs to the most typical link adaptation technology.

In the Long Term Evolution (LTE) system, in order to implement a downlink adaptive modulation and coding technology, it needs to transmit the control signaling including Channel State Information (CSI) in the uplink. The CSI includes a Channel Quality Indication (CQI), a Pre-coding Matrix Indicator (PMI), and a Rank Indicator (RI). The CSI reflects the state of the downlink physical channel. The base station performs downlink scheduling as well as modulation and coding of data using the CSI.

The base station performs scheduling using the CSI reported by the terminal and determines a downlink Modulation and Coding Scheme (MCS) index and resource allocation information. Specifically, the Rel-8 LTE protocol defines a modulation and Transport Block Size (TBS) index table for a Physical Downlink Shared Channel (PDSCH), which may be referred to as a downlink MCS table hereinafter. The table has a total of 32 levels. Each level basically corresponds to a MCS index, and each MCS index essentially corresponds to a MCS. Further, the resource allocation information gives a Number Physical Resource Block (NPRB) which need to be occupied by the downlink transmission. The LTE standard also provides a TBS table. After the MCS index and the NPRB are given, the TBS can be acquired according to the table. With these modulation and coding parameters (MCS/NPRB/TBS), the base station can carry out modulation and coding of the downlink data for downlink transmission.

After the terminal receives the data of the downlink transmission, it needs to obtain the MCS index and the resource allocation information of the downlink transmission for data processing. Further, the base station transmits the MCS index and the resource allocation information through Downlink Control Information (DCI). The base station scrambles Cyclic Redundancy Check (CRC) bits corresponding to the downlink control information using a specific Radio Network Temporary Identity (RNTI), and transmits the downlink control information in a specific DCI format through a Physical Downlink Control Channel (PDCCH). The terminal carries out blind detection in a Common Search Space (CSS) and a User Equipment (UE) specific Search Space (USS) to acquire the downlink control information. After obtaining the downlink control information, the terminal obtains the TBS according to a TBS table, and uses the TBS for demodulation and decoding.

There are a variety of radio network temporary identities, including Semi-Persistent Scheduling (SPS), Semi-Persistent Scheduling Cell RNTI (SPS C-RNTI), Cell RNTI (C-RNTI) etc. DCI formats related to the PDSCH include DCI format 1, DCI format 1A, DCI format 1B, DCI format 1C, DCI format 1D, DCI format 2, DCI format 2A, DCI format 2B, DCI format 2C, DCI format 2D etc.

For the uplink adaptive modulation and coding technique, the base station can acquire uplink channel parameters from a Sounding Reference Signal (SRS) transmitted by the UE and determine the MCS index and the resource allocation information for the uplink transmission of the UE based on the acquired channel parameters. Specifically, the Rel-8 LTE protocol defines a Modulation and TBS index table for a Physical Uplink Shared Channel (PUSCH), which may also be referred to as an uplink MCS table hereinafter. The base station transmits the MCS index and the resource allocation information through the downlink control information. The terminal can carry out the modulation and coding of the uplink data using the information and transmit the uplink data on a corresponding PUSCH resource. The DCI format associated with PUSCH includes DCI format 0, DCI format 3, DCI format 3A, and DCI format 4. It should be illustrated that the downlink MCS table and the uplink MCS table can be collectively referred to as a MCS table.

After LTE system has experienced several versions of Rel-8/9/10/11, research is continuously carried out on the R12 technology. In the existing Rel-11 standard, the uplink and the downlink support a modulation and coding scheme of at most 64 Quadrature Amplitude Modulation (QAM). With the development of heterogeneous networks, small cells need a higher data transmission rate and a higher system spectral efficiency, which requires the introduction of a higher-order modulation and coding scheme, such as 256 QAM. The existing standards cannot meet the requirements. For example, a conventional table of the existing LTE standard, i.e., the CQI table/MCS table/TBS table supports a modulation and coding scheme of at most 64 QAM and a spectral efficiency of about 5.5547 bit/s/Hz.

By taking the LTE system as an example, the above description shows that the conventional table (i.e., the existing CQI table, MCS table and TBS table) cannot support a higher-order modulation. After the introduction of a high-order modulation, such as 256 QAM and 1024QAM in the existing communication system, enhanced tables (new CQI, MCS and TBS tables) supporting the high-order modulation should be designed.

Currently, the conventional table of the communication system can neither support the higher-order modulation, nor can solve the problem of the specific configuration and usage of the enhanced table for the high-order modulation and the conventional table. Therefore, the communication system currently cannot support the higher-order modulation. In scenarios where the channel conditions are good and higher-order modulations may be applied, for example, in small cell scenarios, the improvement of the peak data transmission rate and the spectral efficiency of the system is limited.

SUMMARY

With respect to the technical problem that the conventional table cannot support a higher-order modulation, the present document provides a modulation processing method and apparatus for high-order coding, a base station and a terminal.

In order to achieve the above purpose, according to an embodiment of the present document, a modulation processing method for high-order coding is provided, including: a base station selecting a Modulation and Coding Scheme (MCS) table according to a transmission type and predefined information, herein the MCS table includes a MCS table supporting a M-order modulation and a MCS table not supporting a M-order modulation, herein M>64; and the base station transmitting the downlink control signaling to a terminal, the downlink control signaling including a modulation and coding scheme field $I_{MCS}$, herein the $I_{MCS}$ is based on the MCS table supporting or not supporting a M-order modulation selected by the base station.

In an example embodiment, a base station selecting a MCS table according to a transmission type and predefined information includes: when the transmission type is downlink transmission, the base station selecting a downlink MCS table according to the predefined information, herein the predefined information includes: a table type configured for a subframe set, herein the table type is a Channel Quality Indication (CQI) table supporting a M-order modulation or a CQI table not supporting a M-order modulation.

In an example embodiment, the subframe set includes: subframe set 0 and/or subframe set 1 configured by the base station.

In an example embodiment, when the base station selects the downlink MCS table according to the table type configured for the subframe set, the method further includes at least one of: when the CQI table supporting a M-order modulation is configured for the subframe set 0 or/and the subframe set 1, using the MCS table supporting a M-order modulation for all downlink subframes; and when the CQI table supporting a M-order modulation is configured for subframe set i, using the MCS table supporting a M-order modulation for the subframe set i, and when the CQI table not supporting a M-order modulation is configured for the subframe set i, using the MCS table not supporting a M-order modulation for the subframe set i, herein i=0 or 1; and for subframes not belonging to the subframe set 0 and the subframe set 1, the method includes at least one of: configuring the MCS table supporting or not supporting a M-order modulation through the dedicated high-layer signaling; predefining the MCS table not supporting a M-order modulation to be used; and when the CQI table supporting a M-order modulation is configured for at least one of the subframe set 0 and the subframe set 1, using the MCS table supporting a M-order modulation.

In an example embodiment, a base station selecting a MCS table according to a transmission type and predefined information includes: when the transmission type is uplink transmission, the base station selecting an uplink MCS table according to the predefined information, herein the predefined information includes at least one of: a table type configured during downlink transmission, the table type including at least one of a CQI table supporting a M-order modulation and a MCS table supporting a M-order modulation, a DCI format, herein the DCI carries the modulation and coding scheme field $I_{MCS}$; a search space corresponding to downlink control signaling, the search space including at least one of: a common search space and a UE-specific search space, herein the downlink control signaling carries the modulation and coding scheme field $I_{MCS}$; a Cyclic Redundancy Check (CRC) scrambling mode corresponding to the downlink control signaling, the CRC scrambling mode including at least one of Semi-Persistent Scheduling Cell Radio Network Temporary Identity (SPS C-RNTI) scrambling and Cell Radio Network Temporary Identity (C-RNTI) scrambling, herein the downlink control signaling carries the modulation and coding scheme field $I_{MCS}$; an uplink transmission mode; an uplink subframe set configured by the base station; and a predefined uplink subframe set.

In an example embodiment, the DCI format includes at least one of DCI format 0 and DCI format 4.

In an example embodiment, when the base station selects an uplink MCS table according to the table type configured during downlink transmission, the method further includes at least one of: when the CQI table supporting a M-order modulation and/or the MCS table supporting a M-order modulation is configured for the downlink transmission, configuring an uplink MCS table supporting a M-order modulation for uplink transmission in a specific scenario; when the CQI table supporting a M-order modulation and/or the MCS table supporting a M-order modulation is configured for the downlink transmission and Channel State Information (CSI) is transmitted on a Physical Uplink Shared Channel (PUSCH) for uplink transmission in a specific scenario, configuring an uplink MCS table not supporting a M-order modulation for the uplink transmission; and selecting an uplink MCS table supporting or not supporting a M-order modulation for the uplink transmission through configuration signaling sent by the base station.

In an example embodiment, the specific scenario includes Time Division Duplex (TDD) transmission.

In an example embodiment, when the base station selects an uplink MCS table according to at least one of a DCI format, a search space corresponding to downlink control signaling, a CRC scrambling mode corresponding to the downlink control signaling, and an uplink transmission mode, the method further includes at least one of: when the base station configures uplink transmission mode 1 for the terminal or the DCI format is only configured as DCI format 0, if the search space corresponding to the downlink control signaling is a common search space, the base station selecting an uplink MCS table not supporting a M-order modulation, and if the search space corresponding to the downlink control signaling is a UE-specific search space, the base station selecting an uplink MCS table supporting a M-order modulation; when the base station configures the uplink transmission mode 1 for the terminal or the DCI format is only configured as the DCI format 0, if the CRC scrambling mode corresponding to the downlink control signaling is SPS C-RNTI scrambling, the base station selecting an uplink MCS table not supporting a M-order modulation; and if the CRC-scrambling mode corresponding to the downlink control signaling is C-RNTI scrambling, the base station selecting an uplink MCS table supporting a M-order modulation; when the base station configures the uplink transmission mode 1 for the terminal or the DCI format is only configured as the DCI format 0, if the search space corresponding to the downlink control signaling is a common search space, the base station selecting an uplink MCS table not supporting a M-order modulation; if the search space corresponding to the downlink control signaling is a UE-specific search space and the CRC scrambling mode is SPS C-RNTI scrambling, the base station selecting an uplink MCS table not supporting a M-order modulation; and if the search space corresponding to the downlink control signaling is a UE-specific search space and the CRC scrambling mode is C-RNTI scrambling, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the search space corresponding to the downlink control signaling is a common search space, the base station selecting an uplink MCS table not supporting a M-order modulation; if the base station transmits the downlink control signaling through the DCI format 0 and the search space corresponding to the downlink control signaling is a UE-specific search space, the base station selecting an uplink MCS table supporting a M-order modulation; and if the base station transmits the downlink control signaling through the DCI format 4, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the CRC scrambling mode corresponding to the downlink control signaling is SPS C-RNTI scrambling, the base station selecting an uplink MCS table not supporting a M-order modulation; if the base station transmits the downlink control signaling through the DCI format 0 and the CRC scrambling mode corresponding to the downlink control signaling is C-RNTI scrambling, the base station selecting an uplink MCS table supporting a M-order modulation; and if the base station transmits the downlink control signaling through the DCI format 4, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the search space corresponding to the downlink control signaling is a common search space, the base station selecting an uplink MCS table not supporting a M-order modulation; if the base station transmits the downlink control signaling through the DCI format 0, the search space corresponding to the downlink control signaling is a UE-specific search space and the CRC scrambling mode is SPS C-RNTI scrambling, the base station selecting an uplink MCS table not supporting a M-order modulation; if the base station transmits the downlink control signaling through the DCI format 0, the search space corresponding to the downlink control signaling is a UE-specific search space and the CRC scrambling mode is C-RNTI scrambling, the base station selecting an uplink MCS table supporting a M-order modulation; and if the base station transmits the downlink control signaling through the DCI format 4, the base station selecting an uplink table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0, the base station selecting an uplink MCS table not supporting a M-order modulation; and if the base station transmits the downlink control signaling through the DCI format 4, the base station selecting an uplink MCS table supporting a M-order modulation.

In an example embodiment, when the base station selects an uplink MCS table according to an uplink subframe set configured by the base station or a predefined uplink subframe set, the method further includes at least one of: the base station respectively configuring an uplink MCS table supporting or not supporting a M-order modulation for a subframe set 2 and a subframe set 3, the subframe set 2 and the subframe set 3 being uplink subframe sets configured by the base station or predefined subframe sets; the base station only configuring an uplink MCS table supporting or not supporting a M-order modulation for the subframe set 2, and using an uplink MCS table not supporting a M-order modulation for the subframe set 3, and the base station only configuring an uplink MCS table supporting or not supporting a M-order modulation for the subframe set 3, and using an uplink MCS table not supporting a M-order modulation for the subframe set 2.

In an example embodiment, after the base station selects a MCS table supporting a M-order modulation according to a transmission type and predefined information, the base station transmits the downlink control signaling to the terminal, the downlink control signaling including: a Transmission Power Control (TPC) command field, herein the TPC command field includes at least one of the following characteristics: when the downlink control signaling is transmitted through DCI format 3A, the TPC command field is represented by N1 bits, herein N1 is a positive integer not less than 1, and the value of TPC command corresponding to the TPC command field includes an integer other than −1 and 1; and when the downlink control signaling is transmitted through a DCI format other than the DCI format 3A, the TPC command field is represented by N2 bits, herein N2 is a positive integer equal to or greater than 2, and the value of TPC command corresponding to the TPC command field includes an integer other than −1, 0, 1 and 3.

In order to achieve the above purpose, according to another embodiment of the present document, a modulation processing method for high-order coding is further provided, including: a terminal receiving downlink control signaling transmitted by a base station, the downlink control signaling including a modulation and coding scheme field $I_{MCS}$, herein the $I_{MCS}$ is based on a Modulation and Coding Scheme (MCS) table selected by the base station according to a transmission type and predefined information, herein the MCS table includes a MCS table supporting a M-order modulation and a MCS table not supporting a M-order modulation, herein M>64; and the terminal implementing modulation and coding on uplink data or implementing demodulation and decoding on downlink data according to $I_{MCS}$.

In an example embodiment, when the transmission type is downlink transmission, the base station selecting a downlink MCS table according to the predefined information, herein the predefined information includes: a table type configured for a subframe set, herein the table type is a Channel Quality Indication (CQI) table supporting a M-order modulation or a CQI table not supporting a M-order modulation.

In an example embodiment, the subframe set includes: subframe set 0 and/or subframe set 1 configured by the base station.

In an example embodiment, when the transmission type is downlink transmission and the MCS table selected by the base station is a downlink MCS table, the method further includes at least one of: when the CQI table supporting a M-order modulation is configured for the subframe set 0 or/and the subframe set 1, using the MCS table supporting a M-order modulation for all downlink subframes; and when the CQI table supporting a M-order modulation is configured for subframe set i, using the MCS table supporting a M-order modulation for the subframe set i, and when the CQI table not supporting a M-order modulation is configured for the subframe set i, using the MCS table not supporting a M-order modulation for the subframe set i, herein i=0 or 1; and for subframes not belonging to the subframe set 0 and the subframe set 1, the method includes at least one of: configuring the MCS table supporting or not supporting a M-order modulation through dedicated high-layer signaling; predefining the MCS table not supporting a M-order modulation to be used; and when the CQI table supporting a M-order modulation is configured for at least one of the subframe set 0 and the subframe set 1, using the MCS table supporting a M-order modulation.

In an example embodiment, when the transmission type is uplink transmission, the base station selecting an uplink MCS table according to the predefined information, herein the predefined information includes at least one of: a table type configured during downlink transmission, the table type including at least one of a CQI table supporting a M-order modulation and a MCS table supporting a M-order modulation, a DCI format, herein the DCI carries the modulation and coding scheme field $I_{MCS}$;

a search space corresponding to downlink control signaling, the search space including at least one of: a common search space and a UE-specific search space, herein the downlink control signaling carries the modulation and coding scheme field $I_{MCS}$;

a Cyclic Redundancy Check (CRC) scrambling mode corresponding to the downlink control signaling, the CRC scrambling mode including at least one of Semi-Persistent Scheduling Cell Radio Network Temporary Identity (SPS C-RNTI) scrambling and Cell Radio Network Temporary Identity (C-RNTI) scrambling, herein the downlink control signaling carries the modulation and coding scheme field $I_{MCS}$; an uplink transmission mode; an uplink subframe set configured by the base station; and a predefined uplink subframe set.

In an example embodiment, the DCI format includes at least one of DCI format 0 and DCI format 4.

In an example embodiment, when the base station selects an uplink MCS table according to the table type configured during downlink transmission, the method further includes at least one of: when the CQI table supporting a M-order modulation and/or the MCS table supporting a M-order modulation is configured for the downlink transmission, configuring an uplink MCS table supporting a M-order modulation for uplink transmission in a specific scenario; when the CQI table supporting a M-order modulation and/or the MCS table supporting a M-order modulation is configured for the downlink transmission and Channel State Information (CSI) is transmitted on a Physical Uplink Shared Channel (PUSCH) for uplink transmission in a specific scenario, configuring an uplink MCS table not supporting a M-order modulation for the uplink transmission; and selecting an uplink MCS table supporting or not supporting a M-order modulation for the uplink transmission through configuration signaling sent by the base station.

In an example embodiment, the specific scenario includes Time Division Duplex (TDD) transmission.

In an example embodiment, when the base station selects an uplink MCS table according to at least one of a DCI format, a search space corresponding to downlink control signaling, a CRC scrambling mode corresponding to the downlink control signaling, and an uplink transmission mode, the method further includes at least one of: when the base station configures uplink transmission mode 1 for the terminal or the DCI format is only configured as DCI format 0, if the search space corresponding to the downlink control signaling is a common search space, the base station selecting an uplink MCS table not supporting a M-order modulation, and if the search space corresponding to the downlink control signaling is a UE-specific search space, the base station selecting an uplink MCS table supporting a M-order modulation; when the base station configures the uplink transmission mode 1 for the terminal or the DCI format is only configured as the DCI format 0, if the CRC scrambling mode corresponding to the downlink control signaling is SPS C-RNTI scrambling, the base station selecting an uplink MCS table not supporting a M-order modulation; and if the CRC-scrambling mode corresponding to the downlink control signaling is C-RNTI scrambling, the base station selecting an uplink MCS table supporting a M-order modulation;

when the base station configures the uplink transmission mode 1 for the terminal or the DCI format is only configured as the DCI format 0, if the search space corresponding to the downlink control signaling is a common search space, the base station selecting an uplink MCS table not supporting a M-order modulation; if the search space corresponding to the downlink control signaling is a UE-specific search space and the CRC scrambling mode is SPS C-RNTI scrambling, the base station selecting an uplink MCS table not supporting a M-order modulation; and if the search space corresponding to the downlink control signaling is a UE-specific search space and the CRC scrambling mode is C-RNTI scrambling, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the search space corresponding to the downlink control signaling is a common search space, the base station selecting an uplink MCS table not supporting a M-order modulation; if the base station transmits the downlink control signaling through the DCI format 0 and the search space corresponding to the downlink control signaling is a UE-specific search space, the base station selecting an uplink MCS table supporting a M-order modulation; and if the base station transmits the downlink control signaling through the DCI format 4, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the CRC scrambling mode corresponding to the downlink control signaling is SPS C-RNTI scrambling, the base station selecting an uplink MCS table not supporting a M-order modulation; if the base station transmits the downlink control signaling through the DCI format 0 and the CRC scrambling mode corresponding to the downlink control signaling is C-RNTI scrambling, the base station selecting an uplink MCS table supporting a M-order modulation; and if the base station transmits the downlink control signaling through the DCI format 4, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the search space corresponding to the downlink control signaling is a common search space, the base station selecting an uplink MCS table not supporting a M-order modulation; if the base station transmits the downlink control signaling through the DCI format 0, the search space corresponding to the downlink control signaling is a UE-specific search space and the CRC scrambling mode is SPS C-RNTI scrambling, the base station selecting an uplink MCS table not supporting a M-order modulation; if the base station transmits the downlink control signaling through the DCI format 0, the search space corresponding to the downlink control signaling is a UE-specific search space and the CRC scrambling mode is C-RNTI scrambling, the base station selecting an uplink MCS table supporting a M-order modulation; and if the base station transmits the downlink control signaling through the DCI format 4, the base station selecting an uplink table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0, the base station selecting an uplink MCS table not supporting a M-order modulation; and if the base station transmits the downlink control signaling through the DCI format 4, the base station selecting an uplink MCS table supporting a M-order modulation.

In an example embodiment, when the base station selects an uplink MCS table according to a configured or predefined uplink subframe set, the method further includes at least one of: the base station respectively configuring an uplink MCS table supporting or not supporting a M-order modulation for a subframe set 2 and a subframe set 3, the subframe set 2 and the subframe set 3 being uplink subframe sets configured by the base station or predefined subframe sets; the base station only configuring an uplink MCS table supporting or not supporting a M-order modulation for the subframe set 2, and using an uplink MCS table not supporting a M-order modulation for the subframe set 3, and the base station only configuring an uplink MCS table supporting or not supporting a M-order modulation for the subframe set 3, and using an uplink MCS table not supporting a M-order modulation for the subframe set 2.

In an example embodiment, when the base station selects a MCS table supporting a M-order modulation, the terminal receives the downlink control signaling transmitted by the base station, the downlink control signaling at least including: a Transmission Power Control (TPC) command field, herein the TPC command field includes at least one of the following characteristics: when the downlink control signaling is transmitted through DCI format 3A, the TPC command field is represented by N1 bits, herein N1 is a positive integer not less than 1, and the value of TPC command corresponding to the TPC command field includes an integer other than −1 and 1; and when the downlink control signaling is transmitted through a DCI format other than the DCI format 3A, the TPC command field is represented by N2 bits, herein N2 is a positive integer equal to or greater than 2, and the value of TPC command corresponding to the TPC command field includes an integer other than −1, 0, 1 and 3.

In order to achieve the above purpose, according to a further embodiment of the present document, a modulation processing apparatus for high-order coding is further provided, including: a selection module configured to select a Modulation and Coding Scheme (MCS) table according to a transmission type and predefined information, herein the MCS table includes a MCS table supporting a M-order modulation and a MCS table not supporting a M-order modulation, herein M>64; and a transmission module configured to transmit downlink control signaling to a terminal, the downlink control signaling at least including a modulation and coding scheme field $I_{MCS}$, herein the $I_{MCS}$ is based on the MCS table supporting or not supporting a M-order modulation selected by the base station.

In an example embodiment, the selection module is further configured to, when the transmission type is downlink transmission, select a downlink MCS table according to the predefined information, herein the predefined information includes: a table type configured for a subframe set, herein the table type is a MCS table supporting a M-order modulation or a MCS table not supporting a M-order modulation.

In an example embodiment, the selection module is further configured to when the transmission type is uplink transmission, select an uplink MCS table according to the predefined information, herein the predefined information includes at least one of: a table type configured during downlink transmission, the table type including at least one of a CQI table supporting a M-order modulation and a MCS table supporting a M-order modulation, a DCI format, herein the DCI carries $I_{MCS}$;

a search space corresponding to downlink control signaling, the search space including at least one of: a common search space and a UE-specific search space, herein the downlink control signaling carries $I_{MCS}$;

a Cyclic Redundancy Check (CRC) scrambling mode corresponding to the downlink control signaling, the CRC scrambling mode including at least one of Semi-Persistent Scheduling Cell Radio Network Temporary Identity (SPS C-RNTI) scrambling and Cell Radio Network Temporary Identity (C-RNTI) scrambling, herein the downlink control signaling carries the modulation and coding scheme field $I_{MCS}$; an uplink transmission mode; an uplink subframe set configured by the base station; and a predefined uplink subframe set.

In order to achieve the above purpose, according to a further embodiment of the present document, a modulation processing apparatus for high-order coding is further provided, including: a receiving module configured to receive downlink control signaling transmitted by a base station, the downlink control signaling at least including a modulation and coding scheme field $I_{MCS}$, herein the $I_{MCS}$ is based on a Modulation and Coding Scheme (MCS) table selected by the base station according to a transmission type and predefined information, herein the MCS table includes a MCS table supporting a M-order modulation and a MCS table not supporting a M-order modulation, herein M>64; and a data processing module configured to implement modulation and coding on uplink data according to $I_{MCS}$ or implement demodulation and decoding on downlink data according to $I_{MCS}$.

In an example embodiment, the receiving module is further configured to when the transmission type is downlink transmission, select, by the base station, a downlink MCS table according to the predefined information, and when the predefined information includes the following information, receive $I_{MCS}$: a table type configured for a subframe set, herein the table type is a MCS table supporting a M-order modulation or a MCS table not supporting a M-order modulation.

In an example embodiment, the receiving module is further configured to, when the transmission type is uplink transmission, select, by the base station, a downlink MCS table according to the predefined information, and when the predefined information includes at least one of the following information, receive $I_{MCS}$: a table type configured during downlink transmission, the table type including at least one of a CQI table supporting a M-order modulation and a MCS table supporting a M-order modulation, a DCI format, herein the DCI carries the modulation and coding scheme field $I_{MCS}$; a search space corresponding to downlink control signaling, the search space including at least one of: a common search space and a UE-specific search space, herein the downlink control signaling carries the modulation and coding scheme field $I_{MCS}$; a Cyclic Redundancy Check (CRC) scrambling mode corresponding to the downlink control signaling, the CRC scrambling mode including at least one of Semi-Persistent Scheduling Cell Radio Network Temporary Identity (SPS C-RNTI) scrambling and Cell Radio Network Temporary Identity (C-RNTI) scrambling, herein the downlink control signaling carries the modulation and coding scheme field $I_{MCS}$; an uplink transmission mode; an uplink subframe set configured by the base station; and a predefined uplink subframe set.

In order to achieve the above purpose, according to a further embodiment of the present document, a base station is further provided, including the modulation processing apparatus for high-order coding including the selection module and the transmission module as described above.

In order to achieve the above purpose, according to a further embodiment of the present document, a terminal is further provided, including the modulation processing apparatus for high-order coding including the receiving module and the data processing module as described above.

With the present document, a technical measure of the base station selecting a MCS table according to a transmission type and predefined information and transmitting $I_{MCS}$ based on the MCS table selected by the base station is used to solve the technical problem that the conventional table cannot support a higher-order modulation, thereby achieving the transmission between the base station and the terminal based on the higher-order modulation.

BRIEF DESCRIPTION OF DRAWINGS

Accompanying drawings described here are used to provide further understanding of the present document, and constitute a part of the present application; and the exemplary embodiments and the description thereof are used to explain the present document In the accompanying drawings.

DETAILED EMBODIMENTS

The present document will be described in detail below with reference to accompanying drawings and in conjunction with embodiments. It should be illustrated that the embodiments in the present application and features in the embodiments can be combined with each other without conflict.

Figure 1:
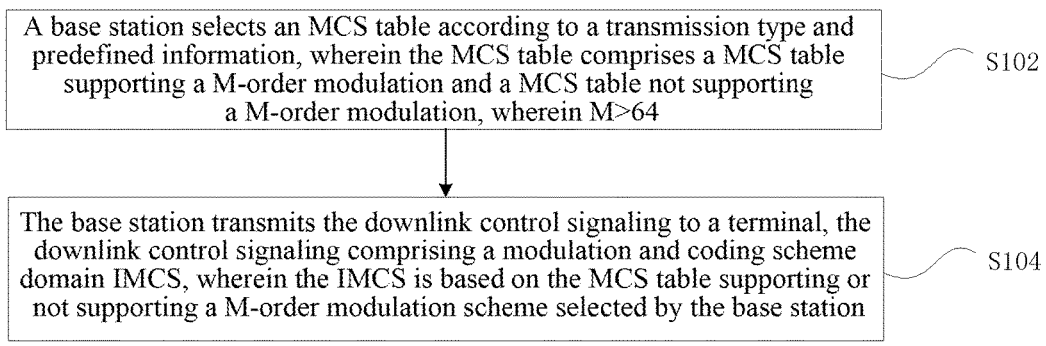
FIG. 1 is a flowchart of a modulation processing method for high-order coding according to an embodiment of the present document.

FIG. 1 is a flowchart of a modulation processing method for high-order coding according to an embodiment of the present disclosure. As shown in FIG. 1, the method includes the following steps.

In step S102, a base station selects a MCS table according to a transmission type and predefined information, herein the MCS table includes a MCS table supporting a M-order modulation and a MCS table not supporting a M-order modulation, herein M>64; and in step S104, the base station transmits a downlink control signaling to a terminal, the downlink control signaling including a modulation and coding scheme field $I_{MCS}$, herein the $I_{MCS}$ is based on the MCS table supporting or not supporting a M-order modulation selected by the base station.

Through the above various processing steps, as the base station selects the MCS table (a MCS table supporting a M-order modulation and a MCS table not supporting a M-order modulation, herein M>64) according to the transmission type and the predefined information and sends the modulation and coding scheme field, it can solve the technical problem that the conventional table cannot support a higher-order modulation, thereby achieving transmission between the base station and the terminal based on the higher-order modulation.

There are many manners for transmitting $I_{MCS}$, for example, through downlink control signaling, i.e., carrying the $I_{MCS}$ through the downlink control signaling.

In the present embodiment, the value of M may be 128, 256, 512, 1024 or the like. In an example embodiment, the value of M is 256.

In the present embodiment, when the transmission type is downlink transmission, the base station selects a downlink MCS table according to the predefined information, herein the predefined information includes: a table type configured for a subframe set, herein the table type is a CQI table supporting a M-order modulation or a CQI table not supporting a M-order modulation.

The subframe set includes: subframe set 0 and/or subframe set 1 configured by the base station. In an example embodiment, the subframe set 0 is a subframe set $C_{CSI,0}$ configured by a high layer for CSI measurement, and the subframe set 1 is a subframe set $C_{CSI,1}$ configured by a high layer for CSI measurement; or the subframe set 0 is a subframe set $C_{CSI,1}$ configured by a high layer for CSI measurement, and the subframe set 1 is a subframe set $C_{CSI,0}$ configured by a high layer for CSI measurement.

When the base station selects the downlink MCS table according to the table type configured for the subframe set, at least one of the following is included:

when the CQI table supporting a M-order modulation is configured for the subframe set 0 or/and the subframe set 1, using the MCS table supporting a M-order modulation for all downlink subframes. In an example embodiment, the MCS table supporting a M-order modulation may be predefined to be used for the downlink subframe, herein "predefined to be used" means that it is not configured through high layer signaling. It should be particularly illustrated that the MCS table supporting a M-order modulation is predefined to be used for the downlink subframe, herein the downlink control signaling in the downlink subframe which includes a modulation and coding scheme field needs to support a M-order modulation, and a CRC scrambling mode of the downlink control signaling needs to support a M-order modulation.

When the CQI table supporting a M-order modulation is configured for subframe set i, using the MCS table supporting a M-order modulation for the subframe set i, and when the CQI table not supporting a M-order modulation is configured for the subframe set i, using the MCS table not supporting a M-order modulation for the subframe set i, herein i=0 or 1; and for subframes not belonging to the subframe set 0 and the subframe set 1, the method includes at least one of:

configuring the MCS table supporting or not supporting a M-order modulation through the dedicated high-layer signaling;

predefining the MCS table not supporting a M-order modulation to be used; and when the CQI table supporting a M-order modulation is configured for at least one of the subframe set 0 and the subframe set 1, using the MCS table supporting a M-order modulation.

In the embodiment, when the transmission type is uplink transmission, the base station selecting an uplink MCS table according to the predefined information, herein the predefined information includes at least one of:

a table type configured during downlink transmission, the table type including at least one of a CQI table supporting a M-order modulation and a MCS table supporting a M-order modulation, a DCI format, herein the DCI carries the modulation and coding scheme field $I_{MCS}$;

a search space corresponding to downlink control signaling, the search space including at least one of: a common search space and a UE-specific search space, herein the DCI carries the modulation and coding scheme field $I_{MCS}$;

a Cyclic Redundancy Check (CRC) scrambling mode corresponding to the downlink control signaling, the CRC scrambling mode including at least one of SPS C-RNTI scrambling and C-RNTI scrambling, herein the DCI carries the modulation and coding scheme field $I_{MCS}$;

an uplink transmission mode;

an uplink subframe set configured by the base station. In an example embodiment, the subframe set may also include the subframe set 0 or the subframe set 1 described above; and a predefined uplink subframe set.

The DCI format includes at least one of DCI format 0 and DCI format 4.

When the base station selects an uplink MCS table according to the table type configured during downlink transmission, at least one of the following is further included:

when the CQI table supporting a M-order modulation and/or the MCS table supporting a M-order modulation is configured for the downlink transmission, configuring an uplink MCS table supporting a M-order modulation for uplink transmission in a specific scenario;

when the CQI table supporting a M-order modulation and/or the MCS table supporting a M-order modulation is configured for the downlink transmission and Channel State Information (CSI) is transmitted on a Physical Uplink Shared Channel (PUSCH) for uplink transmission in a specific scenario, configuring an uplink MCS table not supporting a M-order modulation for the uplink transmission; and selecting an uplink MCS table supporting or not supporting a M-order modulation for the uplink transmission through the configuration signaling sent by the base station.

In an example embodiment, the specific scenario includes Time Division Duplex (TDD) transmission.

When the base station selects an uplink MCS table according to at least one of a DCI format, a search space corresponding to downlink control signaling, a CRC scrambling mode corresponding to the downlink control signaling, and an uplink transmission mode, the method further includes at least one of:

when the base station configures uplink transmission mode 1 for the terminal or the DCI format is only configured as DCI format 0, if the search space corresponding to the downlink control signaling is a common search space, the base station selecting an uplink MCS table not supporting a M-order modulation, and if the search space corresponding to the downlink control signaling is a UE-specific search space, the base station selecting an uplink MCS table supporting a M-order modulation;

when the base station configures the uplink transmission mode 1 for the terminal or the DCI format is only configured as the DCI format 0, if the CRC scrambling mode corresponding to the downlink control signaling is SPS C-RNTI scrambling, the base station selecting an uplink MCS table not supporting a M-order modulation; and if the CRC-scrambling mode corresponding to the downlink control signaling is C-RNTI scrambling, the base station selecting an uplink MCS table supporting a M-order modulation;

when the base station configures the uplink transmission mode 1 for the terminal or the DCI format is only configured as the DCI format 0, if the search space corresponding to the downlink control signaling is a common search space, the base station selecting an uplink MCS table not supporting a M-order modulation; if the search space corresponding to the downlink control signaling is a UE-specific search space and the CRC scrambling mode is SPS C-RNTI scrambling, the base station selecting an uplink MCS table not supporting a M-order modulation; and if the search space corresponding to the downlink control signaling is a UE-specific search space and the CRC scrambling mode is C-RNTI scrambling, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the search space corresponding to the downlink control signaling is a common search space, the base station selecting an uplink MCS table not supporting a M-order modulation; if the base station transmits the downlink control signaling through the DCI format 0 and the search space corresponding to the downlink control signaling is a UE-specific search space, the base station selecting an uplink MCS table supporting a M-order modulation; and if the base station transmits the downlink control signaling through the DCI format 4, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the CRC scrambling mode corresponding to the downlink control signaling is SPS C-RNTI scrambling, the base station selecting an uplink MCS table not supporting a M-order modulation; if the base station transmits the downlink control signaling through the DCI format 0 and the CRC scrambling mode corresponding to the downlink control signaling is C-RNTI scrambling, the base station selecting an uplink MCS table supporting a M-order modulation; and if the base station transmits the downlink control signaling through the DCI format 4, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the search space corresponding to the downlink control signaling is a common search space, the base station selecting an uplink MCS table not supporting a M-order modulation; if the base station transmits the downlink control signaling through the DCI format 0, the search space corresponding to the downlink control signaling is a UE-specific search space and the CRC scrambling mode is SPS C-RNTI scrambling, the base station selecting an uplink MCS table not supporting a M-order modulation; if the base station transmits the downlink control signaling through the DCI format 0, the search space corresponding to the downlink control signaling is a UE-specific search space and the CRC scrambling mode is C-RNTI scrambling, the base station selecting an uplink MCS table supporting a M-order modulation; and if the base station transmits the downlink control signaling through the DCI format 4, the base station selecting an uplink table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0, the base station selecting an uplink MCS table not supporting a M-order modulation; and if the base station transmits the downlink control signaling through the DCI format 4, the base station selecting an uplink MCS table supporting a M-order modulation.

When the base station selects the table type to be an uplink MCS table according to a subframe set configured by the base station, at least one of the following is further included:

the base station respectively configuring an uplink MCS table supporting or not supporting a M-order modulation for a subframe set 2 and a subframe set 3, the subframe set 2 and the subframe set 3 being uplink subframe sets configured by the base station or predefined subframe sets. The predefined subframe set at least includes one of a subframe set which is divided according to different uplink-downlink configuration ratios in the TDD system and a subframe set which is divided according to odd and even subframe numbers in the FDD system. The method includes at least one of:

the base station respectively configuring an uplink MCS table supporting or not supporting a M-order modulation for a subframe set 2 and a subframe set 3, the subframe set 2 and the subframe set 3 being uplink subframe sets configured by the base station or predefined subframe sets;

the base station only configuring an uplink MCS table supporting or not supporting a M-order modulation for the subframe set 2, and using an uplink MCS table not supporting a M-order modulation for the subframe set 3, and the base station only configuring an uplink MCS table supporting or not supporting a M-order modulation for the subframe set 3, and using an uplink MCS table not supporting a M-order modulation for the subframe set 2.

After the base station selects a MCS table supporting a M-order modulation according to a transmission type and predefined information, the base station transmits the downlink control signaling to the terminal, at this time, the downlink control signaling further including: a Transmission Power Control (TPC) command field, herein the TPC command field includes at least one of the following characteristics:

when the downlink control signaling is transmitted through DCI format 3A, the TPC command field is represented by N1 bits, herein N1 is a positive integer not less than 1, and the value of TPC command corresponding to the TPC command field includes but not limited to an integer other than −1 and 1; and when the downlink control signaling is transmitted through a DCI format other than the DCI format 3A, the TPC command field is represented by N2 bits, herein N2 is a positive integer equal to or greater than 2, and the value of TPC command corresponding to the TPC command field includes but not limited to an integer other than −1, 0, 1 and 3.

Figure 2:
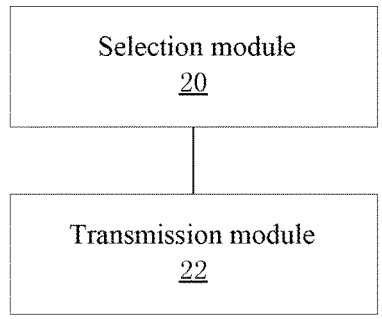
FIG. 2 is a structural block diagram of a modulation processing apparatus for high-order coding according to an embodiment of the present document.

In the present embodiment, a modulation processing apparatus for high-order coding is further provided. As shown in FIG. 2, the apparatus includes:

a selection module 20 configured to select a Modulation and Coding Scheme (MCS) table according to a transmission type and predefined information, herein the MCS table includes a MCS table supporting a M-order modulation and a MCS table not supporting a M-order modulation, herein M>64; and a transmission module 22, connected to the selection module 20, configured to transmit the downlink control signaling to a terminal, the downlink control signaling at least including a modulation and coding scheme field $I_{MCS}$ and a TPC command, herein the $I_{MCS}$ is based on the MCS table supporting or not supporting a M-order modulation selected by the base station.

The selection module 20 is further configured to, when the transmission type is downlink transmission, select a downlink MCS table according to the predefined information, herein the predefined information includes: a table type configured for a subframe set, herein the table type is a MCS table supporting a M-order modulation or a MCS table not supporting a M-order modulation.

The selection module 20 is further configured to, when the transmission type is uplink transmission, select an uplink MCS table according to the predefined information, herein the predefined information includes at least one of:

a table type configured during downlink transmission, the table type including at least one of a CQI table supporting a M-order modulation and a MCS table supporting a M-order modulation, a DCI format;

a search space corresponding to downlink control signaling, the search space including at least one of: a common search space and a UE-specific search space;

a Cyclic Redundancy Check (CRC) scrambling mode corresponding to the downlink control signaling, the CRC scrambling mode including at least one of Semi-Persistent Scheduling Cell Radio Network Temporary Identity (SPS C-RNTI) scrambling and Cell Radio Network Temporary Identity (C-RNTI) scrambling;

an uplink transmission mode; and a subframe set configured by the base station.

It should be illustrated that the selection module 20 and the transmission module 22 may be presented as the software module or hardware module. For the latter, it may be the case that the selection module 20 is located in a first processor and the transmission module 22 is located in a second processor, or both the selection module 20 and the transmission module 22 are located in the first processor.

In the present embodiment, a base station is further provided, including any modulation processing apparatus for high-order coding as described above.

Figure 3:
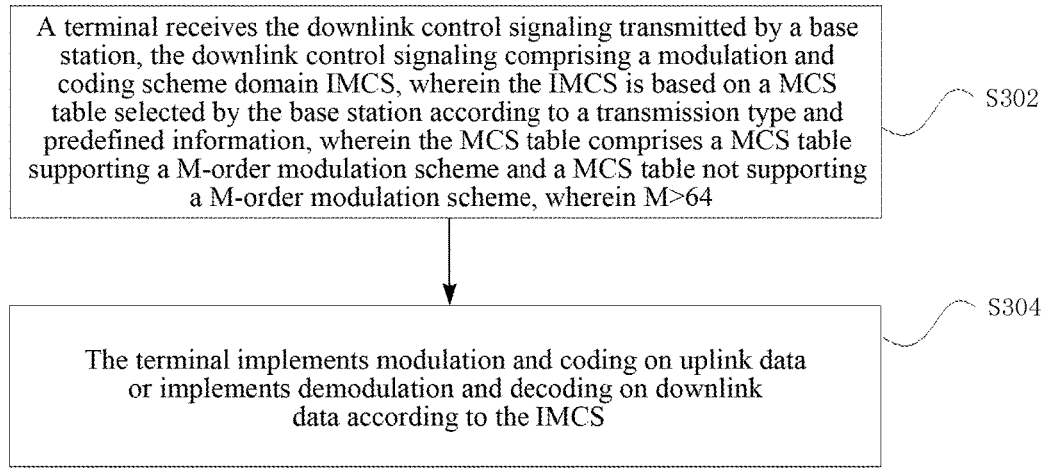
FIG. 3 is a flowchart of another modulation processing method for high-order coding according to an embodiment of the present document.

In the present embodiment, a modulation processing method for high-order coding is further provided, which can be applied in a terminal. As shown in FIG. 3, the method includes the following steps.

In step S302, a terminal receives the downlink control signaling transmitted by a base station, the downlink control signaling including a modulation and coding scheme field $I_{MCS}$, herein the $I_{MCS}$ is based on a Modulation and Coding Scheme (MCS) table selected by the base station according to a transmission type and predefined information, herein the MCS table includes a MCS table supporting a M-order modulation and a MCS table not supporting a M-order modulation, herein M>64; and in S304, the terminal implements modulation and coding on uplink data or implements demodulation and decoding on downlink data according to $I_{MCS}$.

When the transmission type is downlink transmission, the base station selects a downlink MCS table according to the predefined information, herein the predefined information includes: a table type configured for a subframe set, herein the table type is a Channel Quality Indication (CQI) table supporting a M-order modulation or a CQI table not supporting a M-order modulation. The subframe set may include but not limited to: subframe set 0 and/or subframe set 1 configured by the base station.

When the transmission type is downlink transmission and the base station selects a downlink MCS table, at least one of the following steps is included:

when the CQI table supporting a M-order modulation is configured for the subframe set 0 or/and the subframe set 1, using the MCS table supporting a M-order modulation for all downlink subframes; and when the CQI table supporting a M-order modulation is configured for subframe set i, using the MCS table supporting a M-order modulation for the subframe set i, and when the CQI table not supporting a M-order modulation is configured for the subframe set i, using the MCS table not supporting a M-order modulation for the subframe set i, herein i=0 or 1; and for subframes not belonging to the subframe set 0 and the subframe set 1, the method includes at least one of:

configuring the MCS table supporting or not supporting a M-order modulation through the dedicated high-layer signaling;

predefining the MCS table not supporting a M-order modulation to be used and when the CQI table supporting a M-order modulation is configured for at least one of the subframe set 0 and the subframe set 1, using the MCS table supporting a M-order modulation.

When the transmission type is uplink transmission, the base station selects an uplink MCS table according to the predefined information, herein the predefined information includes at least one of:

a table type configured during downlink transmission, the table type including at least one of a CQI table supporting a M-order modulation and a MCS table supporting a M-order modulation, a DCI format, herein the DCI carries the modulation and coding scheme field $I_{MCS}$;

a search space corresponding to downlink control signaling, the search space including at least one of: a common search space and a UE-specific search space, herein the downlink control signaling carries the modulation and coding scheme field $I_{MCS}$;

a Cyclic Redundancy Check (CRC) scrambling mode corresponding to the downlink control signaling, the CRC scrambling mode including at least one of Semi-Persistent Scheduling Cell Radio Network Temporary Identity (SPS C-RNTI) scrambling and Cell Radio Network Temporary Identity (C-RNTI) scrambling, herein the downlink control signaling carries the modulation and coding scheme field $I_{MCS}$;

an uplink transmission mode;

an uplink subframe set configured by the base station; and a predefined uplink subframe set.

The DCI format includes but not limited to at least one of DCI format 0 and DCI format 4.

When the base station selects an uplink MCS table according to the table type configured during downlink transmission, when the CQI table supporting a M-order modulation and/or the MCS table supporting a M-order modulation is configured for the downlink transmission, configuring an uplink MCS table supporting a M-order modulation for uplink transmission in a specific scenario; when the CQI table supporting a M-order modulation and/or the MCS table supporting a M-order modulation is configured for the downlink transmission and Channel State Information (CSI) is transmitted on a Physical Uplink Shared Channel (PUSCH) for uplink transmission in a specific scenario, configuring an uplink MCS table not supporting a M-order modulation for the uplink transmission; and selecting an uplink MCS table supporting or not supporting a M-order modulation for the uplink transmission through configuration signaling sent by the base station.

The specific scenario includes but not limited to TDD transmission.

When the base station selects an uplink MCS table according to at least one of a DCI format, a search space corresponding to downlink control signaling, a CRC scrambling mode corresponding to the downlink control signaling, and an uplink transmission mode, the MCS table may be selected by at least one of:

when the base station configures uplink transmission mode 1 for the terminal or the DCI format is only configured as DCI format 0, if the search space corresponding to the downlink control signaling is a common search space, the base station selecting an uplink MCS table not supporting a M-order modulation, and if the search space corresponding to the downlink control signaling is a UE-specific search space, the base station selecting an uplink MCS table supporting a M-order modulation;

when the base station configures the uplink transmission mode 1 for the terminal or the DCI format is only configured as the DCI format 0, if the CRC scrambling mode corresponding to the downlink control signaling is SPS C-RNTI scrambling, the base station selecting an uplink MCS table not supporting a M-order modulation; and if the CRC-scrambling mode corresponding to the downlink control signaling is C-RNTI scrambling, the base station selecting an uplink MCS table supporting a M-order modulation;

when the base station configures the uplink transmission mode 1 for the terminal or the DCI format is only configured as the DCI format 0, if the search space corresponding to the downlink control signaling is a common search space, the base station selecting an uplink MCS table not supporting a M-order modulation; if the search space corresponding to the downlink control signaling is a UE-specific search space and the CRC scrambling mode is SPS C-RNTI scrambling, the base station selecting an uplink MCS table not supporting a M-order modulation; and if the search space corresponding to the downlink control signaling is a UE-specific search space and the CRC scrambling mode is C-RNTI scrambling, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the search space corresponding to the downlink control signaling is a common search space, the base station selecting an uplink MCS table not supporting a M-order modulation; if the base station transmits the downlink control signaling through the DCI format 0 and the search space corresponding to the downlink control signaling is a UE-specific search space, the base station selecting an uplink MCS table supporting a M-order modulation; and if the base station transmits the downlink control signaling through the DCI format 4, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the CRC scrambling mode corresponding to the downlink control signaling is SPS C-RNTI scrambling, the base station selecting an uplink MCS table not supporting a M-order modulation; if the base station transmits the downlink control signaling through the DCI format 0 and the CRC scrambling mode corresponding to the downlink control signaling is C-RNTI scrambling, the base station selecting an uplink MCS table supporting a M-order modulation; and if the base station transmits the downlink control signaling through the DCI format 4, the base station selecting an uplink MCS table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0 and the search space corresponding to the downlink control signaling is a common search space, the base station selecting an uplink MCS table not supporting a M-order modulation; if the base station transmits the downlink control signaling through the DCI format 0, the search space corresponding to the downlink control signaling is a UE-specific search space and the CRC scrambling mode is SPS C-RNTI scrambling, the base station selecting an uplink MCS table not supporting a M-order modulation; if the base station transmits the downlink control signaling through the DCI format 0, the search space corresponding to the downlink control signaling is a UE-specific search space and the CRC scrambling mode is C-RNTI scrambling, the base station selecting an uplink MCS table supporting a M-order modulation; and if the base station transmits the downlink control signaling through the DCI format 4, the base station selecting an uplink table supporting a M-order modulation;

when the base station configures the uplink transmission mode 2 for the terminal or two DCI formats, i.e., DCI format 0 and DCI format 4 are configured, if the base station transmits the downlink control signaling through the DCI format 0, the base station selecting an uplink MCS table not supporting a M-order modulation; and if the base station transmits the downlink control signaling through the DCI format 4, the base station selecting an uplink MCS table supporting a M-order modulation.

When the base station selects the table type to be an uplink MCS table according to a configured or predefined subframe set, at least one of the following is further included:

the base station respectively configuring an uplink MCS table supporting or not supporting a M-order modulation for a subframe set 2 and a subframe set 3, the subframe set 2 and the subframe set 3 being uplink subframe sets configured by the base station or predefined subframe sets; The method includes at least one of:

the base station respectively configuring an uplink MCS table supporting or not supporting a M-order modulation for a subframe set 2 and a subframe set 3, the subframe set 2 and the subframe set 3 being uplink subframe sets configured by the base station or predefined subframe sets;

the base station only configuring an uplink MCS table supporting or not supporting a M-order modulation for the subframe set 2, and using an uplink MCS table not supporting a M-order modulation for the subframe set 3, and the base station only configuring an uplink MCS table supporting or not supporting a M-order modulation for the subframe set 3, and using an uplink MCS table not supporting a M-order modulation for the subframe set 2.

When the base station selects a MCS table supporting a M-order modulation, the terminal receives the downlink control signaling transmitted by the base station, at this time the downlink control signaling further including: a Transmission Power Control (TPC) command field, herein the TPC command field includes at least one of the following characteristics: when the downlink control signaling is transmitted through DCI format 3A, the TPC command field is represented by N1 bits, herein N1 is a positive integer not less than 1, and the value of TPC command corresponding to the TPC command field includes but not limited to an integer other than −1 and 1; and when the downlink control signaling is transmitted through a DCI format other than the DCI format 3A, the TPC command field is represented by N2 bits, herein N2 is a positive integer equal to or greater than 2, and the value of TPC command corresponding to the TPC command field includes but not limited to an integer other than −1, 0, 1 and 3.

Figure 4:
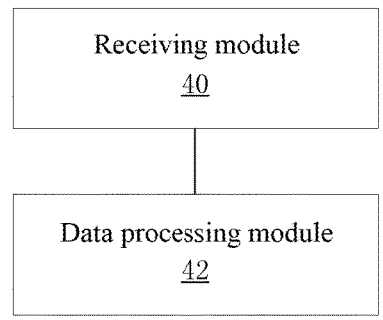
FIG. 4 is a structural block diagram of another modulation processing apparatus for high-order coding according to an embodiment of the present document.

In the present embodiment, a modulation processing apparatus for high-order coding is further included, which can be applied in a terminal. As shown in FIG. 4, the apparatus includes:

a receiving module 40 configured to receive downlink control signaling transmitted by a base station, the downlink control signaling at least including a modulation and coding scheme field $I_{MCS}$. The $I_{MCS}$ is based on a Modulation and Coding Scheme (MCS) table selected by the base station according to a transmission type and predefined information. The MCS table includes a MCS table supporting a M-order modulation and a MCS table not supporting a M-order modulation, herein M>64; and in an example embodiment, the downlink control information may further include a TPC command;

a data processing module 42, connected to the receiving module 40, configured to implement modulation and coding on uplink data according to $I_{MCS}$ or implement demodulation and decoding on downlink data according to $I_{MCS}$.

The receiving module 40 is further configured to, when the transmission type is downlink transmission, select, by the base station, a downlink MCS table according to the predefined information, and when the predefined information includes the following information, receive $I_{MCS}$:

a table type configured for a subframe set, herein the table type is a MCS table supporting a M-order modulation or a MCS table not supporting a M-order modulation.

The receiving module 40 is further configured to, when the transmission type is uplink transmission, select, by the base station, a downlink MCS table according to the predefined information, and when the predefined information includes at least one of the following information, receive $I_{MCS}$:

a table type configured during downlink transmission, the table type including at least one of a CQI table supporting a M-order modulation and a MCS table supporting a M-order modulation, a DCI format, herein the DCI carries the modulation and coding scheme field $I_{MCS}$;

a search space corresponding to downlink control signaling, the search space including at least one of: a common search space and a UE-specific search space, herein the downlink control signaling carries the modulation and coding scheme field $I_{MCS}$;

a Cyclic Redundancy Check (CRC) scrambling mode corresponding to the downlink control signaling, the CRC scrambling mode including at least one of Semi-Persistent Scheduling Cell Radio Network Temporary Identity (SPS C-RNTI) scrambling and Cell Radio Network Temporary Identity (C-RNTI) scrambling, herein the downlink control signaling carries the modulation and coding scheme field $I_{MCS}$;

an uplink transmission mode;

an uplink subframe set configured by the base station; and a predefined uplink subframe set.

In the present embodiment, a terminal is further provided, including any modulation processing apparatus for high-order coding described above.

Currently, the conventional table of the communication system can neither support the higher-order modulation, nor can solve the problem of the specific configuration and usage of the enhanced table for the high-order modulation and the conventional table, for example, in which condition, it is to configure the enhanced table for the high-order modulation and in which condition, it is to use the conventional table.

In order to solve the above problem, the embodiments of the present document provide a modulation processing method, apparatus and system for high-order coding. A base station selects a table supporting a M-order modulation or selects a table not supporting a M-order modulation according to a transmission type and predefined information. The transmission type is uplink transmission or downlink transmission. The table supporting a M-order modulation is a MCS table supporting a M-order modulation, and the table not supporting a M-order modulation is a MCS table not supporting a M-order modulation, herein M is greater than or equal to 256 and is a positive integer. The base station transmits the downlink control signaling, the downlink control signaling at least including a modulation and coding scheme field (IMCS), herein the IMCS is based on the table supporting or not supporting a M-order modulation selected by the base station. The embodiments of the present document will be described in detail below in conjunction with accompanying drawings. It should be illustrated that the embodiments in the present application and the features in the embodiments can be combined with each other randomly without conflict.

Embodiment One

In embodiment one, a MCS table used for downlink subframe is determined according to a CQI table configured for a predefined subframe set. The predefined subframe set includes subframe set 0 and/or subframe set 1 configured by a base station. Said determining a MCS table used for downlink subframe according to a CQI table configured for a predefined subframe set includes: using a MCS table supporting 256QAM for all downlink subframes including subframes that do not belong to configured subframe set 0/1, when a CQI table supporting 256QAM is configured for at least one of the predefined subframe sets.

Sub-Embodiment one: in this embodiment, the base station transmits the configuration signaling to the terminal, herein the signaling configures subframe set 0 and subframe set 1. The base station transmits configuration signaling 1 to the terminal, and the signaling configures a table supporting a 256QAM modulation for the subframe set 0, herein the table supporting 256QAM is a CQI table supporting 256QAM; and it selects a table not supporting 256QAM for the subframe set 1, herein the table not supporting 256QAM is a CQI table of the LTE Rel-11 version standard 36.213. The base station transmits the downlink control signaling to the terminal on a downlink subframe. The downlink control signaling includes a modulation and coding scheme field (IMCS). The terminal receives the downlink control signaling transmitted by the base station, herein the IMCS is based on the MCS table supporting 256QAM. When the CQI table supporting 256QAM is configured for at least one of the subframe set 0 and the subframe set 1, a MCS table supporting 256QAM is configured for all the downlink subframes. This simplifies the configuration, and increases the opportunity to exploit high-order modulation, i.e. 256 QAM. It improves the spectral efficiency using 256QAM in a high signal-to-noise ratio condition.

Sub-Embodiment two: in this embodiment, the base station transmits the configuration signaling to the terminal, herein the signaling configures subframe set 0 and subframe set 1. The base station transmits configuration signaling 1 to the terminal, and the signaling configures a table supporting a 256QAM modulation for the subframe set 1, herein the table supporting 256QAM is a CQI table supporting 256QAM; and it selects a table not supporting 256QAM for the subframe set 0, herein the table not supporting 256QAM is a CQI table of the LTE Rel-11 version standard 36.213. The base station transmits the downlink control signaling to the terminal on a downlink subframe. The downlink control signaling includes a modulation and coding scheme field (IMCS). The IMCS is based on the MCS table supporting 256QAM. When the CQI table supporting 256QAM is configured for at least one of the subframe set 0 and the subframe set 1, a MCS table supporting 256QAM is configured for all the downlink subframes. This simplifies the configuration, and improves the spectral efficiency using 256QAM in a high signal-to-noise ratio condition.

Sub-Embodiment three: in this embodiment, the base station transmits configuration signaling to the terminal, herein the signaling configures subframe set 0 and subframe set 1. The base station transmits configuration signaling 1 to the terminal, and the signaling configures a table supporting a 256QAM modulation for the subframe set 0, herein the table supporting 256QAM is a CQI table supporting 256QAM; and it selects a table not supporting 256QAM for the subframe set 1, herein the table not supporting 256QAM is a CQI table of the LTE Rel-11 version standard 36.213. The base station transmits the downlink control signaling to the terminal on the subframe set 0. The downlink control signaling includes a modulation and coding scheme field (IMCS), herein the IMCS is based on the MCS table supporting 256QAM. The base station transmits the downlink control signaling to the terminal on the subframe set 1 and subframe set 2. The downlink control signaling includes a modulation and coding scheme field (IMCS). The IMCS is based on a MCS table not supporting 256QAM. The MCS table for the downlink subframe is selected according to the table configured for the subframe set, which better utilizes the signal to interference plus noise ratio condition of the channel to configure the table, and better achieves adaptive modulation and coding, thereby improving the system throughput.

Sub-Embodiment four: in this embodiment, the base station transmits the configuration signaling to the terminal, herein the signaling configures subframe set 0 and subframe set 1. The base station transmits configuration signaling 1 to the terminal, and the signaling configures a table supporting a 256QAM modulation for the subframe set 1, herein the table supporting 256QAM is a CQI table supporting 256QAM; and it selects a table not supporting 256QAM for the subframe set 0, herein the table not supporting 256QAM is a CQI table of the LTE Rel-11 version standard 36.213. The base station transmits the downlink control signaling to the terminal on the subframe set 1. The downlink control signaling includes a modulation and coding scheme field (IMCS), herein the IMCS is based on the MCS table supporting 256QAM. The base station transmits the downlink control signaling to the terminal on the subframe set 0. The downlink control signaling includes a modulation and coding scheme field ($I_{MCS}$). The IMCS is based on a MCS table not supporting 256QAM. The base station transmits configuration signaling 2 to the terminal. The signaling configures a MCS table supporting a 256QAM modulation for the subframe set 2. The base station transmits the downlink control signaling, on the subframe set 2, to the terminal. The downlink control signaling includes a modulation and coding scheme field (IMCS), herein the IMCS is based on the MCS table supporting 256QAM. For the subframe sets 0 and 1, the MCS table for the downlink subframe is selected according to the table configured for the subframe set, which better utilizes the signal to interference plus noise ratio condition of the channel to configure the table, and better achieves adaptive modulation and coding, thereby improving the system throughput. For the subframe set 2, the table is configured by a high layer according to the signal to interference plus noise ratio condition of the channel, which is also used to better achieve adaptive modulation and coding, thereby improving the system throughput.

Embodiment Two

The configuration of the uplink MCS table is as follows: 1) determining the use of the uplink MCS table from the type of the configured downlink CQI table and/or MCS table; and 2) configuring the uplink MCS table through independent Radio Resource Control (RRC).

Sub-Embodiment one: in this embodiment, the base station transmits configuration signaling 0 to the terminal, herein the configuration signaling 0 selects an enhanced table supporting or not supporting 256QAM for downlink transmission. The enhanced table supporting 256QAM is a CQI table or MCS table supporting 256QAM. The enhanced table not supporting 256QAM is a CQI table and/or MCS table not supporting 256QAM. The base station transmits configuration signaling 1 to the terminal, and the configuration signaling 1 selects the enhanced table supporting 256QAM for uplink transmission. The enhanced table supporting 256QAM is a MCS table supporting 256QAM. The base station transmits the downlink control signaling to the terminal through DCI format 0 or DCI format 4. The downlink control signaling includes a modulation and coding scheme field (IMCS). The base station receives, on a PUSCH, uplink data which does not include a CSI transmitted by the terminal, herein the IMCS is based on a MCS table supporting 256QAM. The selections of the uplink table and the downlink table are independent, which can better utilize the signal to interference plus noise ratio condition of the channel to configure the table, and better achieves adaptive modulation and coding, thereby improving the system throughput.

Sub-Embodiment two: in this embodiment, the base station transmits configuration signaling 0 to the terminal, herein the configuration signaling 0 selects an enhanced table supporting or not supporting 256QAM for downlink transmission. The enhanced table supporting 256QAM is a CQI table or MCS table supporting 256QAM. The enhanced table not supporting 256QAM is a CQI table and/or MCS table not supporting 256QAM. The base station transmits configuration signaling 1 to the terminal, and the configuration signaling 1 selects the enhanced table supporting 256QAM for uplink transmission. The enhanced table supporting 256QAM is a MCS table supporting 256QAM. The base station transmits the downlink control signaling to the terminal through DCI format 0 or DCI format 4. The downlink control signaling includes a modulation and coding scheme field (IMCS). The base station receives, on a PUSCH, CSI data transmitted by the terminal, herein the $I_{MCS}$ is based on a MCS table not supporting 256QAM. The selections of the uplink table and the downlink table are independent, which can better utilize the signal to interference plus noise ratio condition of the channel to configure the table, and better achieves adaptive modulation and coding, thereby improving the system throughput. For the condition of transmission of the CSI data on the PUSCH, it should try to use a low-order modulation to ensure the accuracy of the transmission. Therefore, there is no need to use the MCS table supporting 256QAM. Instead, the MCS table not supporting 256QAM may have finer granularity of the spectral efficiency in an area with low spectral efficiency, which can better achieve adaptive modulation and coding.

Sub-Embodiment three: in this embodiment, a specific scenario is assumed. This specific scenario includes a TDD scenario. Two nodes, i.e., node 1 and node 2, transmit downlink data to the terminal. A downlink enhanced table supporting 256QAM is configured for the node 1. A downlink enhanced table not supporting 256QAM is configured for the node 2. The downlink enhanced table supporting 256QAM is a CQI table or MCS table supporting 256QAM. The downlink enhanced table not supporting 256QAM is a CQI table and/or MCS table not supporting 256QAM. The node 1 or node 2 transmits the downlink control signaling to the terminal through DCI format 0 or DCI format 4. The downlink control signaling includes a modulation and coding scheme field (IMCS). The nodes 1 and 2 receive, on a PUSCH, uplink data which does not include a CSI transmitted by the terminal, herein the IMCS is based on a MCS table supporting 256QAM. The table is configured for the uplink according to the downlink table, which considers channel reciprocity in the specific scenario, thereby simplifying the configuration of the table.

Sub-Embodiment four: in this embodiment, a specific scenario is assumed. This specific scenario includes a TDD scenario. Two nodes, i.e., node 1 and node 2, transmit downlink data to the terminal. A downlink enhanced table supporting 256QAM is configured for the node 1. A downlink enhanced table not supporting 256QAM is configured for the node 2. The downlink enhanced table supporting 256QAM is a CQI table or MCS table supporting 256QAM. The downlink enhanced table not supporting 256QAM is a CQI table and/or MCS table not supporting 256QAM. The node 1 or node 2 transmits the downlink control signaling to the terminal through DCI format 0 or DCI format 4. The downlink control signaling includes a modulation and coding scheme field ($I_{MCS}$). The nodes 1 and 2 receive, on a PUSCH, uplink data which includes a CSI transmitted by the terminal, herein the IMCS is based on a MCS table not supporting 256QAM. For the condition of transmission of the CSI data on the PUSCH, it should try to use a low-order modulation to ensure the accuracy of the transmission. Therefore, there is no need to use the MCS table supporting 256QAM. Instead, the MCS table not supporting 256QAM may have the finer granularity of the spectral efficiency in an area with low spectral efficiency, which can better achieve adaptive modulation and coding.

Embodiment Three

The use of an uplink MCS table supporting or not supporting 256QAM is determined according to a DCI format, a search space, a CRC scrambling mode, or an uplink transmission mode.

Sub-Embodiment one: in this embodiment, it is assumed that the base station configures uplink transmission mode 1 for the terminal, or only configures a format of DCI format 0 for the terminal. The base station transmits the downlink control signaling to the terminal through the DCI format 0 and a common search space, herein the downlink control signaling includes a modulation and coding scheme field (IMCS), which is based on a MCS table not supporting 256QAM. The base station receives, on the PUSCH, uplink data transmitted by the terminal. This configuration results from the use of 256QAM being directed to a particular UE.

Sub-Embodiment two: in this embodiment, it is assumed that the base station configures uplink transmission mode 1 for the terminal, or only configures a format of DCI format 0 for the terminal. The base station transmits the downlink control signaling to the terminal through the DCI format 0 and a UE-specific search space, herein the downlink control signaling includes a modulation and coding scheme field (IMCS), which is based on a MCS table supporting 256QAM. The base station receives, on the PUSCH, uplink data transmitted by the terminal. This configuration results from the use of 256QAM being directed to a particular UE.

Sub-Embodiment three: in this embodiment, it is assumed that the base station configures uplink transmission mode 1 for the terminal, or only configures a format of DCI format 0 for the terminal. The base station transmits the downlink control signaling to the terminal through the DCI format 0, herein the downlink control signaling includes a modulation and coding scheme field (IMCS), and CRC corresponding to the downlink control signaling is scrambled through a SPS C-RNTI. Then, the IMCS is based on a MCS table not supporting 256QAM. The base station receives, on the PUSCH, uplink data transmitted by the terminal. This configuration is obtained because the use of 256QAM should be flexibly configured according to a signal to interference plus noise ratio condition.

Sub-Embodiment four: in this embodiment, it is assumed that the base station configures uplink transmission mode 1 for the terminal, or only configures a format of DCI format 0 for the terminal. The base station transmits the downlink control signaling to the terminal through the DCI format 0, herein the downlink control signaling includes a modulation and coding scheme field (IMCS), and CRC corresponding to the downlink control signaling is scrambled through a C-RNTI. Then, the IMCS is based on a MCS table supporting 256QAM. The base station receives, on the PUSCH, uplink data transmitted by the terminal. This configuration is obtained because the use of 256QAM should be flexibly configured according to a signal to interference plus noise ratio condition.

Sub-Embodiment five: in this embodiment, it is assumed that the base station configures uplink transmission mode 1 for the terminal, or only configures a format of DCI format 0 for the terminal. The base station transmits the downlink control signaling to the terminal through the DCI format 0 and a UE-specific search space, herein the downlink control signaling includes a modulation and coding scheme field ($I_{MCS}$), and CRC corresponding to the downlink control signaling is scrambled through a SPS C-RNTI. Then, the IMCS is based on a MCS table not supporting 256QAM. The base station receives, on the PUSCH, uplink data transmitted by the terminal. This configuration is obtained because the use of 256QAM is directed to a particular UE and the use of 256QAM should be flexibly configured according to a signal to interference plus noise ratio condition.

Sub-Embodiment six: in this embodiment, it is assumed that the base station configures uplink transmission mode 1 for the terminal, or only configures a format of DCI format 0 for the terminal. The base station transmits the downlink control signaling to the terminal through the DCI format 0 and a UE-specific search space, herein the downlink control signaling includes a modulation and coding scheme field ($I_{MCS}$), and CRC corresponding to the downlink control signaling is scrambled through a C-RNTI. Then, the $I_{MCS}$ is based on a MCS table supporting 256QAM. The base station receives, on the PUSCH, uplink data transmitted by the terminal. This configuration is obtained because the use of 256QAM is directed to a particular UE and the use of 256QAM should be flexibly configured according to a signal to interference plus noise ratio condition.

Sub-Embodiment seven: in this embodiment, it is assumed that the base station configures uplink transmission mode 2 for the terminal, or configures two formats, i.e., DCI format 0/4 for the terminal. The base station transmits the downlink control signaling to the terminal through the DCI format 0, herein the downlink control signaling includes a modulation and coding scheme field ($I_{MCS}$). The $I_{MCS}$ is based on a MCS table not supporting 256QAM. The base station transmits the downlink control signaling to the terminal through the DCI format 4, herein the downlink control signaling includes a modulation and coding scheme field ($I_{MCS}$). The $I_{MCS}$ is based on a MCS table supporting 256QAM. The base station receives, on the PUSCH, uplink data transmitted by the terminal. The DCI format 4 is used for transmission of multiple code words, and it may correspond to a higher signal to interference plus noise ratio. Therefore, the corresponding uplink transmission may be more likely to use 256QAM.

Sub-Embodiment eight: in this embodiment, it is assumed that the base station configures the uplink transmission mode 2 for the terminal, or configures two formats, i.e., DCI format 0/4 for the terminal. When the base station transmits the downlink control signaling to the terminal through the DCI format 0 and a common search space and the downlink control signaling includes a modulation and coding scheme field ($I_{MCS}$), the $I_{MCS}$ is based on a MCS table not supporting 256QAM. When the base station transmits the downlink control signaling to the terminal through the DCI format 0 and a UE-specific search space and the downlink control signaling includes a modulation and coding scheme field ($I_{MCS}$), the $I_{MCS}$ is based on a MCS table supporting 256QAM. When the base station transmits the downlink control signaling to the terminal through the DCI format 4 and the downlink control signaling includes a modulation and coding scheme field ($I_{MCS}$), the IMCS is based on a MCS table supporting 256QAM. The base station receives, on the PUSCH, uplink data transmitted by the terminal. For the DCI format 0, a table supporting 256QAM is also configured, which provides possibility to use 256QAM. This considers that it should try to use 256QAM to improve the spectral efficiency. Further, the use of 256QAM is directed to a particular UE.

Sub-Embodiment nine: in this embodiment, it is assumed that the base station configures uplink transmission mode 2 for the terminal, or configures two formats, i.e., DCI format 0/4 for the terminal. When the base station transmits the downlink control signaling to the terminal through the DCI format 0, the downlink control signaling includes a modulation and coding scheme field ($I_{MCS}$) and CRC corresponding to the downlink control signaling is scrambled through a SPS C-RNTI, the $I_{MCS}$ is based on a MCS table not supporting 256QAM. When the base station transmits the downlink control signaling to the terminal through the DCI format 0, the downlink control signaling includes a modulation and coding scheme field ($I_{MCS}$) and the CRC corresponding to the downlink control signaling is scrambled through a C-RNTI, the $I_{MCS}$ is based on a MCS table supporting 256QAM. When the base station transmits the downlink control signaling to the terminal through the DCI format 4 and the downlink control signaling includes a modulation and coding scheme field ($I_{MCS}$), the $I_{MCS}$ is based on a MCS table supporting 256QAM. The base station receives, on the PUSCH, uplink data transmitted by the terminal. For the DCI format 0, a table supporting 256QAM is also configured, which provides possibility to use 256QAM. This considers that it should try to use 256QAM to improve the spectral efficiency. Further, the use of 256QAM should be flexibly configured according to a signal to interference plus noise ratio condition.

Sub-Embodiment ten: in this embodiment, it is assumed that the base station configures the uplink transmission mode 2 for the terminal, or configures two formats, i.e., DCI format 0/4 for the terminal. When the base station transmits the downlink control signaling to the terminal through the DCI format 0 and a common search space and the downlink control signaling includes a modulation and coding scheme field ($I_{MCS}$), the $I_{MCS}$ is based on a MCS table not supporting 256QAM. When the base station transmits the downlink control signaling to the terminal through the DCI format 0 and a UE-specific search space, herein the downlink control signaling includes a modulation and coding scheme field ($I_{MCS}$), and a CRC corresponding to the downlink control signaling is scrambled through a C-RNTI, the IMCS is based on a MCS table supporting 256QAM. When the base station transmits the downlink control signaling to the terminal through the DCI format 0 and the UE-specific search space, the downlink control signaling includes a modulation and coding scheme field ($I_{MCS}$) and the CRC corresponding to the downlink control signaling is scrambled through a SPS-C-RNTI, the $I_{MCS}$ is based on a MCS table not supporting 256QAM. When the base station transmits the downlink control signaling to the terminal through the DCI format 4 and the downlink control signaling includes a modulation and coding scheme field ($I_{MCS}$), the $I_{MCS}$ is based on a MCS table supporting 256QAM. The base station receives, on the PUSCH, uplink data transmitted by the terminal. For the DCI format 0, a table supporting 256QAM is also configured, which provides possibility to use 256QAM. This considers that it should try to use 256QAM to improve the spectral efficiency. Further, the use of 256QAM is directed to a particular UE, and the use of 256QAM should be flexibly configured according to a signal to interference plus noise ratio condition.

Embodiment Four

When the base station selects an uplink MCS table supporting 256QAM, a mapping relationship from a TPC command field in a DCI format 0/3/3A/4 to a TPC command is designed. Currently, power control of Release 11 version LTE protocol 36.213 is directed to 64QAM and a lower-order modulation. Design of a new mapping relationship considers that a higher signal to interference plus noise ratio condition is needed for 256QAM. A higher signal to interference plus noise ratio can be provided through uplink power control.

Sub-Embodiment one: in this embodiment, the base station transmits the configuration signaling to the terminal, herein the signaling configures a MCS table supporting 256QAM for uplink transmission. The base station transmits the downlink control signaling to the terminal through the DCI format 0 or the DCI format 4 or the DCI format 3, herein the downlink control signaling includes a TPC command field. The value of the TPC command field is 0, 1, 2 or 3. A mapping relationship from the TPC command field to an absolute and accumulated TPC command is as shown in Table 1:

TABLE 1

Mapping from a TPC command field in the DCI format 0/3/4 to an absolute and accumulated $\delta_{PUSCH,c}$ value

| TPC Command Field in DCI format 0/3/4 | Accumulated $\delta_{PUSCH,c}$ [dB] | Absolute $\delta_{PUSCH,c}$ [dB] only DCI format 0/4 |
|---|---|---|
| 0 | −1 | −5 |
| 1 | 0 | −2 |
| 2 | 1.5 | 2 |
| 3 | 3.5 | 5 |

Sub-Embodiment two: in this embodiment, the base station transmits the configuration signaling to the terminal, herein the signaling configures a MCS table supporting 256QAM for uplink transmission. The base station transmits the downlink control signaling to the terminal through the DCI format 0 or the DCI format 4 or the DCI format 3, herein the downlink control signaling includes a TPC command field. The value of the TPC command field is 0, 1, 2 . . . or 7. A mapping relationship from the TPC command field to an absolute and accumulated TPC command is as shown in Table 2:

TABLE 2

Mapping from a TPC command field in the DCI format 0/3/4 to an absolute and accumulated $\delta_{PUSCH,c}$ value

| TPC Command Field in DCI format 0/3/4 | Accumulated $\delta_{PUSCH,c}$ [dB] | Absolute $\delta_{PUSCH,c}$ [dB] only DCI format 0/4 |
|---|---|---|
| 0 | −1 | −4 |
| 1 | 0 | −1 |
| 2 | 1 | 1 |
| 3 | 3 | 4 |
| 4 | 4 | −5 |
| 5 | −2 | 5 |
| 6-7 | Reserved | |

Sub-Embodiment three: in this embodiment, the base station transmits the configuration signaling to the terminal, herein the signaling configures a MCS table supporting 256QAM for uplink transmission. The base station transmits the downlink control signaling to the terminal through the DCI format 3A, herein the downlink control signaling includes a TPC command field. The value of the TPC command field is 0 or 1. A mapping relationship from the TPC command field to an accumulated TPC command is as shown in the following table:

TABLE 3

Mapping from a TPC command field in the DCI format 3A to an accumulated $\delta_{PUSCH,c}$ value

| TPC Command Field in DCI format 3A | Accumulated $\delta_{PUSCH,c}$ [dB] |
|---|---|
| 0 | −1.5 |
| 1.5 | 1.5 |

Sub-Embodiment four: in this embodiment, the base station transmits the configuration signaling to the terminal, herein the signaling configures a MCS table supporting 256QAM for uplink transmission. The base station transmits the downlink control signaling to the terminal through the DCI format 3A, herein the downlink control signaling includes a TPC command field. The value of the TPC command field is 0, 1, 2 or 3. A mapping relationship from the TPC command field to an accumulated TPC command is as shown in the following table:

TABLE 4

Mapping from a TPC command field in the DCI format 3A to an accumulated $\delta_{PUSCH,c}$ value

| TPC Command Field in DCI format 3A | Accumulated $\delta_{PUSCH,c}$ [dB] |
|---|---|
| 0 | −1 |
| 1 | 1 |
| 2 | −2 |
| 3 | 2 |

Embodiment Five

Uplink MCS Table supporting 256QAM is designed. Currently, an uplink MCS table of the Release 11 version LTE protocol 36.213 supports at most 64QAM, and does not support 256QAM.

Sub-Embodiment one: in this embodiment, the base station transmits the configuration signaling to the terminal, herein the signaling configures a MCS table supporting 256QAM for uplink transmission. The base station transmits the downlink control signaling to the terminal through DCI format 0 or DCI format 4, herein the downlink control signaling includes a modulation and coding scheme field ($I_{MCS}$). The IMCS is based on a PUSCH modulation, TBS index and redundancy version table as follows. In table 5, the highest spectral efficiency level (ITBS=26) for 64QAM and levels corresponding to first six odd ITBSs in the PUSCH modulation, TBS index and redundancy version table of the Release 11 version LTE protocol 36.213 are deleted, and 7 256QAM levels are added:

TABLE 5

| MCS Index $I_{MCS}$ | Modulation Order $Q'_m$ | TBS Index $I_{TBS}$ | Redundancy Version rvidx |
|---|---|---|---|
| 0 | 2 | 0 | 0 |
| 1 | 2 | 2 | 0 |
| 2 | 2 | 4 | 0 |
| 3 | 2 | 6 | 0 |
| 4 | 2 | 8 | 0 |
| 5 | 2 | 10 | 0 |
| 6 | 4 | 10 | 0 |
| 7 | 4 | 12 | 0 |
| 8 | 4 | 13 | 0 |
| 9 | 4 | 14 | 0 |
| 10 | 4 | 15 | 0 |
| 11 | 4 | 16 | 0 |
| 12 | 4 | 17 | 0 |
| 13 | 4 | 18 | 0 |
| 14 | 4 | 19 | 0 |
| 15 | 6 | 19 | 0 |
| 16 | 6 | 20 | 0 |
| 17 | 6 | 21 | 0 |
| 18 | 6 | 22 | 0 |
| 19 | 6 | 23 | 0 |
| 20 | 6 | 24 | 0 |
| 21 | 6 | 25 | 0 |
| 22 | 8 | 27 | 0 |
| 23 | 8 | 28 | 0 |
| 24 | 8 | 29 | 0 |
| 25 | 8 | 30 | 0 |
| 26 | 8 | 31 | 0 |
| 27 | 8 | 32 | 0 |
| 28 | 8 | 33 | 0 |
| 29 | reserved | | 1 |
| 30 | | | 2 |
| 31 | | | 3 |

Sub-Embodiment two: in this embodiment, the base station transmits the configuration signaling to the terminal, herein the signaling configures a MCS table supporting 256QAM for uplink transmission. The base station transmits the downlink control signaling to the terminal through DCI format 0 or DCI format 4, herein the downlink control signaling includes a modulation and coding scheme field ($I_{MCS}$). The IMCS is based on a PUSCH modulation, TBS index and redundancy version table as follows. In table 6, levels corresponding to first four odd ITBSs, a 16QAM level corresponding to ITBS=10, a 64QAM level corresponding to ITBS=19 and the highest spectral efficiency level (ITBS=26) for 64QAM (a total of 7 levels) in the PUSCH modulation, TBS index and redundancy version table of the Release 11 version LTE protocol 36.213 are deleted, and 7 256QAM levels are added:

TABLE 6

| MCS Index $I_{MCS}$ | Modulation Order $Q'_m$ | TBS Index $I_{TBS}$ | Redundancy Version rvidx |
|---|---|---|---|
| 0 | 2 | 0 | 0 |
| 1 | 2 | 2 | 0 |
| 2 | 2 | 4 | 0 |
| 3 | 2 | 6 | 0 |

TABLE 6-continued

| MCS Index $I_{MCS}$ | Modulation Order $Q'_m$ | TBS Index $I_{TBS}$ | Redundancy Version rvidx |
|---|---|---|---|
| 4 | 2 | 8 | 0 |
| 5 | 2 | 9 | 0 |
| 6 | 2 | 10 | 0 |
| 7 | 4 | 11 | 0 |
| 8 | 4 | 12 | 0 |
| 9 | 4 | 13 | 0 |
| 10 | 4 | 14 | 0 |
| 11 | 4 | 15 | 0 |
| 12 | 4 | 16 | 0 |
| 13 | 4 | 17 | 0 |
| 14 | 4 | 18 | 0 |
| 15 | 4 | 19 | 0 |
| 16 | 6 | 20 | 0 |
| 17 | 6 | 21 | 0 |
| 18 | 6 | 22 | 0 |
| 19 | 6 | 23 | 0 |
| 20 | 6 | 24 | 0 |
| 21 | 6 | 25 | 0 |
| 22 | 8 | 27 | 0 |
| 23 | 8 | 28 | 0 |
| 24 | 8 | 29 | 0 |
| 25 | 8 | 30 | 0 |
| 26 | 8 | 31 | 0 |
| 27 | 8 | 32 | 0 |
| 28 | 8 | 33 | 0 |
| 29 | reserved | | 1 |
| 30 | | | 2 |
| 31 | | | 3 |

Sub-Embodiment three: in this embodiment, the base station transmits the configuration signaling to the terminal, herein the signaling configures a MCS table supporting 256QAM for uplink transmission. The base station transmits the downlink control signaling to the terminal through DCI format 0 or DCI format 4, herein the downlink control signaling includes a modulation and coding scheme field ($I_{MCS}$). The IMCS is based on a PUSCH modulation, TBS index and redundancy version table as follows. In table 7, levels corresponding to first five odd ITBSs, a 16QAM level corresponding to ITBS=10 and the highest spectral efficiency level (ITBS=26) for 64QAM (a total of 7 levels) in the PUSCH modulation, TBS index and redundancy version table of the Release 11 version LTE protocol 36.213 are deleted, and 7 256QAM levels are added:

TABLE 7

| MCS Index $I_{MCS}$ | Modulation Order $Q'_m$ | TBS Index $I_{TBS}$ | Redundancy Version rvidx |
|---|---|---|---|
| 0 | 2 | 0 | 0 |
| 1 | 2 | 2 | 0 |
| 2 | 2 | 4 | 0 |
| 3 | 2 | 6 | 0 |
| 4 | 2 | 8 | 0 |
| 5 | 2 | 10 | 0 |
| 6 | 4 | 11 | 0 |
| 7 | 4 | 12 | 0 |
| 8 | 4 | 13 | 0 |
| 9 | 4 | 14 | 0 |
| 10 | 4 | 15 | 0 |
| 11 | 4 | 16 | 0 |
| 12 | 4 | 17 | 0 |
| 13 | 4 | 18 | 0 |
| 14 | 4 | 19 | 0 |
| 15 | 6 | 19 | 0 |
| 16 | 6 | 20 | 0 |
| 17 | 6 | 21 | 0 |
| 18 | 6 | 22 | 0 |
| 19 | 6 | 23 | 0 |
| 20 | 6 | 24 | 0 |
| 21 | 6 | 25 | 0 |
| 22 | 8 | 27 | 0 |
| 23 | 8 | 28 | 0 |
| 24 | 8 | 29 | 0 |
| 25 | 8 | 30 | 0 |
| 26 | 8 | 31 | 0 |
| 27 | 8 | 32 | 0 |
| 28 | 8 | 33 | 0 |
| 29 | reserved | | 1 |
| 30 | | | 2 |
| 31 | | | 3 |

In conclusion, the modulation processing apparatus for high-order coding according to the embodiments of the present document can be combined with the modulation processing method for high-order coding according to the embodiments of the present document. The base station selects a table supporting a M-order modulation or a table not supporting a M-order modulation according to a transmission type and predefined information. The transmission type is uplink transmission or downlink transmission. The table supporting a M-order modulation is a MCS table supporting a M-order modulation, and the table not supporting a M-order modulation is a MCS table not supporting a M-order modulation, herein M>256 and it is a positive integer. The base station transmits downlink control information including at least a modulation and coding scheme field ($I_{MCS}$), herein the $I_{MCS}$ is based on the table supporting or not supporting a M-order modulation selected by the base station. The transmission between the base station and the terminal based on a higher-order modulation in the downlink and the uplink is achieved, thus solving the existing problem that the communication system cannot support a higher-order modulation. In the technical solutions according to the embodiments of the present document, supporting or not supporting the use of the M-order modulation is flexibly configured according to a signal to interference plus noise ratio condition, which supports the high-order modulation on the basis of compatibility with the existing wireless transmission network, can better realize the adaptive modulation and coding while ensuring accuracy of transmission, thereby improving the system peak rate and the spectral efficiency; and the configuration should be simplified as much as possible, thereby reducing the complexity of the table configuration.

With the technical solutions according to the above embodiments, it is possible to reasonably configure the use of the M-order modulation (herein M is greater than or equal to 256), which provides an appropriate signal to interference plus noise ratio condition for the use of the M-order modulation. This can well support the use of the M-order modulation, trade off the relationship between the improvement of the spectrum efficiency and the guarantee of the accuracy of the transmission, thereby simplifying the configuration and improving the peak data transmission rate and throughput of the wireless communication system.

In another embodiment, there is also provided software for carrying out the technical solutions described in the above-described embodiments and example embodiments.

In another embodiment, there is also provided a storage medium having the above-described software stored therein, including, but not limited to, an optical disk, a floppy disk, a hard disk, a rewritable memory etc.

Obviously, those skilled in the art should understand that each module or each step of the aforementioned present document can be implemented with general computing apparatuses, and they can be integrated in a single computing apparatus, or distributed in a network composed of a plurality of computing apparatuses; alternatively, they can be implemented with program codes executable by the computing apparatuses, and therefore, they can be stored in storage apparatuses to be executed by the computing apparatuses; in some cases, the steps illustrated or described can be performed in an order different from that described here; alternatively, they are respectively made into a plurality of integrated circuit modules; and alternatively, it is implemented with making several modules or steps of them into a single integrated circuit module. Thus, the present document is not limited to any specific combinations of hardware and software.

The above description is only the embodiments of the present document, and it is not used to limit the present document. For those skilled in the art, the present document can have a variety of modifications and changes. Any change, equivalent replacement and improvement etc. made within the spirit and the principle of the present document should be contained within the protection scope of the present document.

INDUSTRIAL APPLICABILITY

In the above technical solutions provided by the present document, a technical measure of the base station selecting a MCS table according to a transmission type and predefined information and transmitting $I_{MCS}$ based on the MCS table selected by the base station is used to solve the technical problem that the conventional table cannot support a higher-order modulation, thereby achieving the transmission between the base station and the terminal based on the higher-order modulation.

What is claimed is:

1. A modulation processing method for high-order coding, comprising:
a base station selecting a Modulation and Coding Scheme, MCS, table according to a transmission type and predefined information, wherein the MCS table comprises a first table for supporting a M-order modulation and a second table for supporting modulations below the M-order modulation, wherein M>64; and
the base station transmitting a downlink control signaling to a terminal, the downlink control signaling comprising a modulation and coding scheme field $I_{MCS}$, wherein the $I_{MCS}$ is based on the first MCS table supporting or the second MCS table selected by the base station; wherein a base station selecting a MCS table according to a transmission type and predefined information comprises:
when the transmission type is downlink transmission, the base station selecting a downlink MCS table according to the predefined information, wherein the predefined information comprises: a table type configured for a subframe set, wherein the table type is a first Channel Quality Indication, CQI, table for supporting the M-order modulation or a second CQI table for supporting modulations below the M-order modulation;
wherein the subframe set comprises: subframe set 0 and/or subframe set 1 configured by the base station, when the base station selects the downlink MCS table according to the table type configured for the subframe set, the method further comprises
when the first CQI table is configured for the subframe set 0 and/or the subframe set 1, using the first MCS table for all downlink subframes.

2. The method according to claim 1, wherein after the base station selects the first MCS table according to a transmission type and predefined information, the base station transmits the downlink control signaling to the terminal, the downlink control signaling comprising: a Transmission Power Control, TPC, command field, wherein the TPC command field comprises at least one of the following characteristics:
when the downlink control signaling is transmitted through DCI format 3A, the TPC command field is represented by N1 bits, wherein N1 is a positive integer not less than 1, and at least one of the values of a TPC command corresponding to the TPC command field is different from −1 and 1; and
when the downlink control signaling is transmitted through a DCI format other than the DCI format 3A, the TPC command field is represented by N2 bits, wherein N2 is a positive integer equal to or greater than 2, and at least one of the values of the TPC command corresponding to the TPC command field is different from −1, 0, 1 and 3.

3. A modulation processing method for high-order coding, comprising:
a terminal receiving a downlink control signaling transmitted by a base station, the downlink control signaling comprising a modulation and coding scheme field $I_{MCS}$, wherein the $I_{MCS}$ is based on a Modulation and Coding Scheme, MCS, table selected by the base station according to a transmission type and predefined information, wherein the MCS table comprises a first MCS table for supporting a M-order modulation and a second MCS table for supporting modulations below the M-order modulation, wherein M>64; and
the terminal implementing modulation and coding on uplink data or implementing demodulation and decoding on downlink data according to $I_{MCS}$; wherein
when the transmission type is downlink transmission, the base station selecting a downlink MCS table according to the predefined information, wherein the predefined information comprises: a table type configured for a subframe set, wherein the table type is a first Channel Quality Indication, CQI, table for supporting the M-order modulation or a second CQI table for supporting modulations below the M-order modulation;
wherein the subframe set comprises: subframe set 0 and/or subframe set 1 configured by the base station,
wherein when the transmission type is downlink transmission and the MCS table selected by the base station is a downlink MCS table, the method further comprises:
when the first CQI table is configured for the subframe set 0 and/or the subframe set 1, using the first MCS table for all downlink subframes.

4. The method according to claim 3, wherein when the base station selects the first MCS table, the terminal receives a downlink control signaling transmitted by the base station, the downlink control signaling at least comprising: a Transmission Power Control, TPC, command field, wherein the TPC command field comprises at least one of the following characteristics:

when the downlink control signaling is transmitted through DCI format 3A, the TPC command field is represented by N1 bits, wherein N1 is a positive integer not less than 1, and at least one of the values of a TPC command corresponding to the TPC command field is different from −1 and 1; and when the downlink control signaling is transmitted through a DCI format other than the DCI format 3A, the TPC command field is represented by N2 bits, wherein N2 is a positive integer equal to or greater than 2, and at least one of the values of a TPC command corresponding to the TPC command field is different from −1, 0, 1 and 3.

5. A modulation processing apparatus for high-order coding, comprising:

a selection module configured to select a Modulation and Coding Scheme, MCS, table according to a transmission type and predefined information, wherein the MCS table comprises a first MCS table for supporting a M-order modulation and a second MCS table for supporting modulations below the M-order modulation, wherein M>64; and a transmission module configured to transmit a downlink control signaling to a terminal, the downlink control signaling at least comprising a modulation and coding scheme field $I_{MCS}$, wherein the $I_{MCS}$ is based on the first MCS table the second table selected by the base station;

wherein the selection module is further configured to, when the transmission type is downlink transmission, select a downlink MCS table according to the predefined information, wherein the predefined information comprises: a table type configured for a subframe set, wherein the table type is the first MCS table or the second MCS table;

wherein the subframe set comprises: subframe set 0 and/or subframe set 1 configured by the base station, wherein when the transmission type is downlink transmission and the MCS table selected by the base station is a downlink MCS table, the method further comprises:

when the first CQI table is configured for the subframe set 0 and/or the subframe set 1, using the first MCS table for all downlink subframes.

6. A base station, comprising the apparatus according to claim 5.

7. A modulation processing apparatus for high-order coding, comprising:

a receiving module configured to receive a downlink control signaling transmitted by a base station, the downlink control signaling at least comprising a modulation and coding scheme field $I_{MCS}$, wherein the $I_{MCS}$ is based on a Modulation and Coding Scheme, MCS, table selected by the base station according to a transmission type and predefined information, wherein the MCS table comprises a first MCS table for supporting a M-order modulation and a second MCS table for supporting modulations below the M-order modulation, wherein M>64; and a data processing module configured to implement modulation and coding on uplink data according to $I_{MCS}$ or implement demodulation and decoding on downlink data according to $I_{MCS}$; wherein the receiving module is further configured to when the transmission type is downlink transmission, select, by the base station, a downlink MCS table according to the predefined information, and when the predefined information comprises the following information, receive $I_{MCS}$:

a table type configured for a subframe set, wherein the table type is the first MCS table or the second MCS table;

wherein the subframe set comprises: subframe set 0 and/or subframe set 1 configured by the base station, wherein when the transmission type is downlink transmission and the MCS table selected by the base station is a downlink MCS table, the method further comprises:

when the first CQI table is configured for the subframe set 0 and/or the subframe set 1, using the first MCS table for all downlink subframes.

8. A terminal, comprising the apparatus according to claim 7.

* * * * *